US011327132B2

(12) United States Patent
Li et al.

(10) Patent No.: US 11,327,132 B2
(45) Date of Patent: May 10, 2022

(54) SYSTEM AND METHOD FOR MAGNETIC RESONANCE IMAGING ACCELERATION

(71) Applicant: SHANGHAI UNITED IMAGING HEALTHCARE CO., LTD., Shanghai (CN)

(72) Inventors: Guobin Li, Shanghai (CN); Jinguang Zong, Shanghai (CN); Zhaopeng Li, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 554 days.

(21) Appl. No.: 15/826,783

(22) Filed: Nov. 30, 2017

(65) Prior Publication Data

US 2019/0004133 A1 Jan. 3, 2019

Related U.S. Application Data

(63) Continuation of application No. PCT/CN2017/090936, filed on Jun. 29, 2017.

(51) Int. Cl.
*G01R 33/48* (2006.01)
*G06T 5/00* (2006.01)
(Continued)

(52) U.S. Cl.
CPC ....... *G01R 33/4818* (2013.01); *G01R 33/561* (2013.01); *G01R 33/5608* (2013.01);
(Continued)

(58) Field of Classification Search
CPC .. G01R 33/4818–4824; G01R 33/5612; G01R 33/561
See application file for complete search history.

(56) References Cited

U.S. PATENT DOCUMENTS 8,692,549 B2 4/2014 Grady et al.
2009/0001984 A1 1/2009 Hwang
(Continued)

FOREIGN PATENT DOCUMENTS

CN 101975935 A 2/2011
CN 103048632 A 4/2013
(Continued)

OTHER PUBLICATIONS

International Search Report for PCT/CN2017/090936 dated Apr. 3, 2018, 4 pages.
(Continued)

*Primary Examiner* — Vincent Rudolph
*Assistant Examiner* — Raphael Schwartz
(74) *Attorney, Agent, or Firm* — Metis IP LLC

(57) ABSTRACT

Systems and methods for magnetic resonance imaging acceleration. The systems may perform the methods to obtain imaging data of a subject, or a portion thereof, captured by the MRI system according to an undersampling pattern; execute a first iterative procedure; determine that the first iteration number meets a first threshold; execute, in response to the determination that the first iteration number meets the first threshold, a second iterative procedure; determine that a sum of the first iteration number and the second iteration number meets a second threshold; and generate a reconstruction image of the subject, or a portion thereof, according to the processed imaging data, wherein the first threshold is lower than the second threshold.

17 Claims, 16 Drawing Sheets

(51) Int. Cl.
*G01R 33/561* (2006.01)
*G01R 33/56* (2006.01)
(52) U.S. Cl.
CPC .......... *G01R 33/5611* (2013.01); *G06T 5/002* (2013.01); *G06T 2207/10088* (2013.01)

(56) References Cited

U.S. PATENT DOCUMENTS

| | | | |
|---|---|---|---|
| 2012/0133361 | A1 | 5/2012 | Gross |
| 2014/0218026 | A1 | 8/2014 | Moeller et al. |
| 2015/0279065 | A1* | 10/2015 | Li ................. G01R 33/5611 382/131 |
| 2016/0313429 | A1* | 10/2016 | Van Den Brink ... G01R 33/283 |
| 2016/0349340 | A1* | 12/2016 | Choi ................. G01R 33/4818 |

FOREIGN PATENT DOCUMENTS

| | | |
|---|---|---|
| CN | 103064046 A | 4/2013 |
| CN | 104217448 A | 12/2014 |
| CN | 105467339 A | 4/2016 |
| CN | 106842089 A | 6/2017 |

OTHER PUBLICATIONS

Written Opinion of the International Searching Authority for PCT/CN2017/090936 dated Apr. 3, 2018, 4 pages.

Klass P. Pruessmann et al. SENSE: Sensitivity Encoding for Fast MRI. Magn Reson Med 42, pp. 952-962, 1999.

Mark A Griswold et al. Generalized Autocalibrating Partially Parallel Acquisitions (GRAPPA). Magnetic Resonance in Medicine 47, 2002. pp. 1202-1210.

Michael Lustig et al. Sparse MRI: The Application of Compressed Sensing for Rapid MR Imaging. Magnetic Resonance in Medicine 58, 2007 pp. 1182-1195.

Douglas C. Noll et al. Homodyne Detection in Magnetic Resonance Imaging. IEEE Transactions on Medical Imaging, vol. 10, No. 2, Jun. 1991. pp. 154-163.

EM Haacke et al. A fast, iterative, partial-fourier technique capable of local phase recovery. Journal of Magnetic Resonance 92(1), 1991. pp. 126-145.

Lustig M et al. L1 SPIR-iT: autocalibrating parallel imaging compressed sensing. In: Proceedings of the 17th scientific meeting, International Society for Magnetic Resonance in Medicine, Hawaii, p. 379, 2009.

F Liu Compressed sensing MRI combined with SENSE in partial k-space. Physics in Medicine and Biology 57 (21): N391-N403, 2012.

Tony F. Chan et al., Total Variation Improved Wavelet Thresholding in Image Compression, Image Procesing, 2000, 4 Pages.

Suhyung Park et al., Compressed Sensing MRI Exploiting Complementary Dual Decomposition, Medical Image Analysis, vol. 18, No. 3, 2014, pp. 472-486.

Jianwei Ma, Improved Iterative Curvelet Thresholding for Compressed Sending and Measurement, Ieeetransactions on Instumentation Measurement, vol. 60, No. 1, 2011, 11 Pages.

Extented European Search Report in European Application No. 17801318.1 dated Mar. 6, 2019, 15 Pages.

* cited by examiner

1100

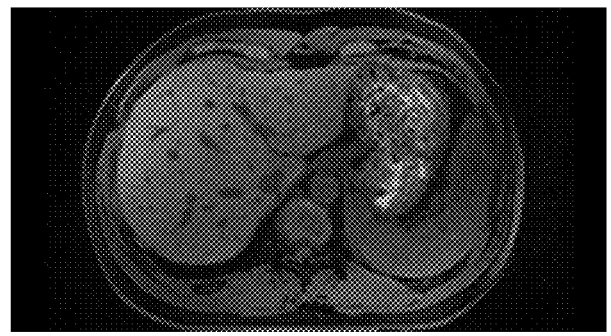
FIG. 20-A
FIG. 20-B
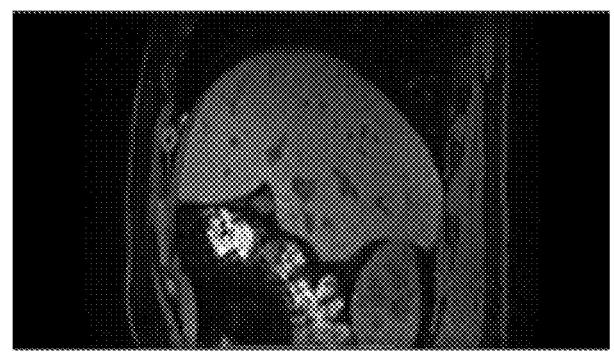
FIG. 20-C

SYSTEM AND METHOD FOR MAGNETIC RESONANCE IMAGING ACCELERATION

CROSS-REFERENCE TO RELATED APPLICATIONS

This present application is a continuation of International Application No. PCT/CN2017/090936, filed on Jun. 29, 2017, designating the United States of America, the contents of which are hereby incorporated by reference.

TECHNICAL FIELD

The present disclosure generally relates to magnetic resonance imaging (MRI), and more specifically, relates to methods and systems for magnetic resonance imaging acceleration.

BACKGROUND

Magnetic resonance imaging (MRI) is a medical imaging technique used in radiology to acquire images of the anatomy and/or the physiological processes of an object in health or disease. In order to accelerate the speed of the MRI, a k-space undersampling pattern may often be implemented, in which the sampling frequency of data is lower than the Nyquist Sampling Theorem. Various k-space undersampling patterns may reduce the quality of an image reconstructed from the k-space data so acquired, which in turn may interfere with diagnosis on the basis of such an image. It is desirable to provide systems and methods for accelerating the speed of magnetic resonance imaging with improved imaging quality.

SUMMARY

A first aspect of the present disclosure relates to a system including at least one non-transitory computer-readable storage medium including a set of instructions and at least one processor in communication with the at least one non-transitory computer-readable storage medium. When executing the instructions, the system may be directed to divide a plane of a k-space into a first region and a second region; assign the first region a full sampling pattern; assign at least one part of the second region an irregular undersampling pattern; and determine a Magnetic Resonance Imaging (MRI) scanning plan according to the plane of the k-space. In some embodiments, the k-space may be a Fourier space of a three dimensional MRI image, and the plane of the k-space may be based on at least one phase encoding direction of a pulse sequence.

A second aspect of the present disclosure relates to a method implemented on a computing device having at least one processor, at least one computer-readable storage medium, and a communication port connected to a Magnetic Resonance Imaging (MRI) system. The method may include dividing a plane of a k-space into a first region and a second region; assigning the first region a full sampling pattern; assigning at least one part of the second region an irregular undersampling pattern; and determining an MRI scanning plan according to the plane of the k-space. In some embodiments, the k-space may be a Fourier space of a three dimensional MRI image, and the plane of the k-space may be based on at least one phase encoding direction of a pulse sequence.

In some embodiments, the first region may be located in a center section of the plane of the k-space, and the second region may be located in a surrounding section of the plane of the k-space.

In some embodiments, the irregular undersampling pattern may be at least one of a random undersampling pattern or a restrained undersampling pattern.

In some embodiments, the method may further comprise dividing the second region into a third region and a fourth region; and assigning at least one part of the third region the irregular undersampling pattern.

In some embodiments, the method may further comprise assigning at least one part of the fourth region a regular undersampling pattern. In some embodiments, a sampling rate of the fourth region may be 1/R, and R may be a positive integer greater than 1.

In some embodiments, the method may further comprise dividing the second region into a fifth region, a sixth region, a seventh region, and an eighth region.

In some embodiments, the first region may be located in a center section of the plane of the k-space, the first region may be defined by at least four sides including two sides in a first direction and two sides in a second direction different from the first direction, the fifth region may be located along the two sides of the first region in the first direction, the sixth region may be located along the two sides of the first region in the second direction, the sixth region may be defined by at least two sides in the first direction, the seventh region may be located along the two sides of the sixth region in the first direction. In some embodiments, the first region may have a larger sampling density than the fifth region, and the sixth region may have a larger sampling density than the seventh region.

A third aspect of the present disclosure relates to a system including at least one non-transitory computer-readable storage medium including a set of instructions and at least one processor in communication with the at least one non-transitory computer-readable storage medium. When executing the instructions, the system may be directed to obtain imaging data of a subject, or a portion thereof, captured by an MRI system according to an undersampling pattern; execute a first iterative procedure; determine that the first iteration number meets a first threshold; execute, in response to the determination that the first iteration number meets the first threshold, a second iterative procedure; determine that a sum of the first iteration number and the second iteration number meets a second threshold; and generate a reconstruction image of the subject, or a portion thereof, according to the processed imaging data. In some embodiments, the first threshold is lower than the second threshold.

A fourth aspect of the present disclosure relates to a method implemented on a computing device having at least one processor, at least one computer-readable storage medium, and a communication port connected to a Magnetic Resonance Imaging (MRI) system. The method may include obtaining imaging data of a subject, or a portion thereof, captured by the MRI system according to an undersampling pattern; executing a first iterative procedure; determining that the first iteration number meets a first threshold; executing, in response to the determination that the first iteration number meets the first threshold, a second iterative procedure; determining that a sum of the first iteration number and the second iteration number meets a second threshold; and generating a reconstruction image of the subject, or a portion thereof, according to the processed imaging data. In some embodiments, the first threshold is lower than the second threshold.

In some embodiments, the first iterative procedure may further comprise performing a soft-thresholding de-noising operation on the sparsifying transform domain of the imaging data; and determining a first iteration number of the soft-thresholding de-noising operation.

In some embodiments, the second iterative procedure may further comprise performing a total variation algorithm on the de-noised imaging data to provide processed imaging data; and determining a second iteration number of the total variation operation.

In some embodiments, the method may further comprise optimizing the total variation algorithm by a gradient descent operation.

In some embodiments, the first iterative procedure further comprise filling-back the acquired imaging data into the k-space obtained after de-noising operation; and performing the de-noising operation on the sparsifying transform domain of the filled-back imaging data.

In some embodiments, the method may further comprise determining that the sum of the first iteration number and the second iteration number is lower than the second threshold; performing a weighted synthesis operation on the processed imaging data to generate synthesized imaging data; and performing the soft-thresholding de-noising operation on the sparsifying transform domain of the synthesized imaging data.

In some embodiments, the method may further comprise performing a parallel imaging procedure on the imaging data.

In some embodiments, the method may further comprise determining a reference phase of the imaging data; performing a high-pass filtering operation on the imaging data to generate filtered imaging data; determining that the sum of the first iteration number and the second iteration number meets the second threshold; and performing, based on the reference phase, a phase correction operation on the filtered imaging data to generate phase corrected imaging data.

In some embodiments, the method may further comprise performing a parallel imaging procedure on the phase corrected imaging data.

A fifth aspect of the present disclosure relates to a system including at least one non-transitory computer-readable storage medium including a set of instructions and at least one processor in communication with the at least one non-transitory computer-readable storage medium. When executing the instructions, the system may be directed to obtain imaging data of a subject, or a portion thereof, captured by an MRI system according to an undersampling pattern; determine a reference phase of an image based on the imaging data; perform a high-pass filtering operation on the imaging data to provide filtered imaging data; perform a parallel imaging procedure on the filtered imaging data; perform a phase correction operation on the imaging data to provide phase corrected imaging data; output the phase corrected imaging data; and determine a reconstruction image of the subject, or a portion thereof, according to the phase corrected imaging data.

A sixth aspect of the present disclosure relates to a method implemented on a computing device having at least one processor, at least one computer-readable storage medium, and a communication port connected to a Magnetic Resonance Imaging (MRI) system. The method may include obtaining imaging data of a subject, or a portion thereof, captured by the MRI system according to an undersampling pattern; determining a reference phase of an image based on the imaging data; performing a high-pass filtering operation on the imaging data to provide filtered imaging data; performing a parallel imaging procedure on the filtered imaging data; performing a phase correction operation on the imaging data to provide phase corrected imaging data; outputting the phase corrected imaging data; and determining a reconstruction image of the subject, or a portion thereof, according to the phase corrected imaging data.

A seventh aspect of the present disclosure relates to a system including an MRI scanner for scanning a subject according to an MRI scanning plan and obtaining imaging data thereof and a processing engine configured to divide, by a k-space division unit, a plane of a k-space into a first region and a second region; assign, by a sampling pattern assignation unit, the first region a full sampling pattern; assign, by the sampling pattern assignation unit, at least one part of the second region an irregular undersampling pattern; determine, by an MRI scanning plan determination unit, the MRI scanning plan based on the assigned first region and second region of the k-space; and obtain, by a processing module, an MR image of the subject according to the imaging data and one or more image reconstruction procedures.

In some embodiments, the one or more image reconstructing procedures may include a parallel imaging procedure, a compressed sensing procedure, and a half-Fourier imaging procedure.

In some embodiments, the MR image associated with the second region of the k-space may be reconstructed by at least one of the parallel imaging procedure, compressed sensing procedure, and the half-Fourier imaging procedure.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIGS. 20-A to 20-C show exemplary MRI images reconstructed based on the image reconstruction techniques according to some embodiments of the present disclosure.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by other expression if they achieve the same purpose.

Figure 3:
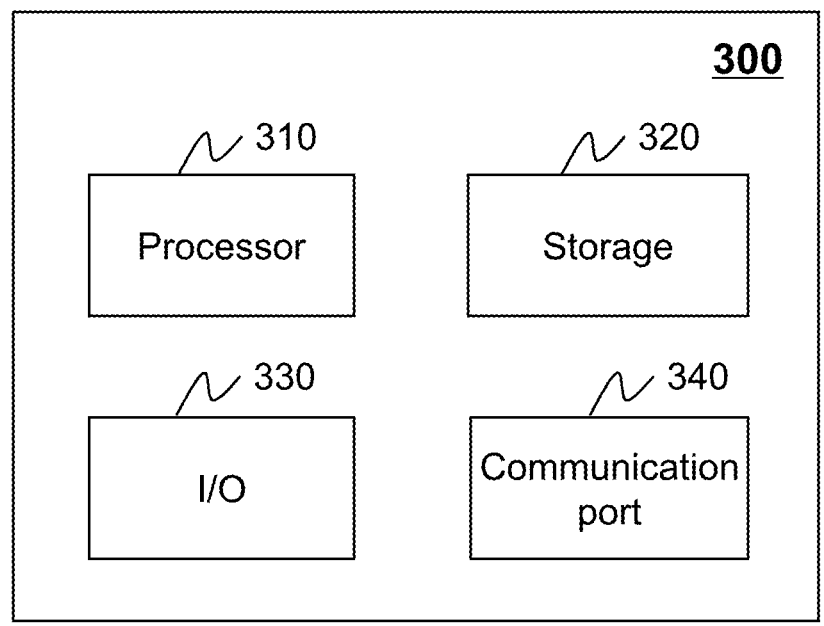
FIG. 3 is a schematic diagram illustrating exemplary hardware and/or software components of an exemplary computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in a firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following description is provided to help better understanding MRI acceleration methods and/or systems. The term "image" used in this disclosure may refer to a 2D image, a 3D image, a 4D image, and/or any related imaging data (e.g., MRI data, projection data corresponding to the MRI data). This is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

Figure 1:
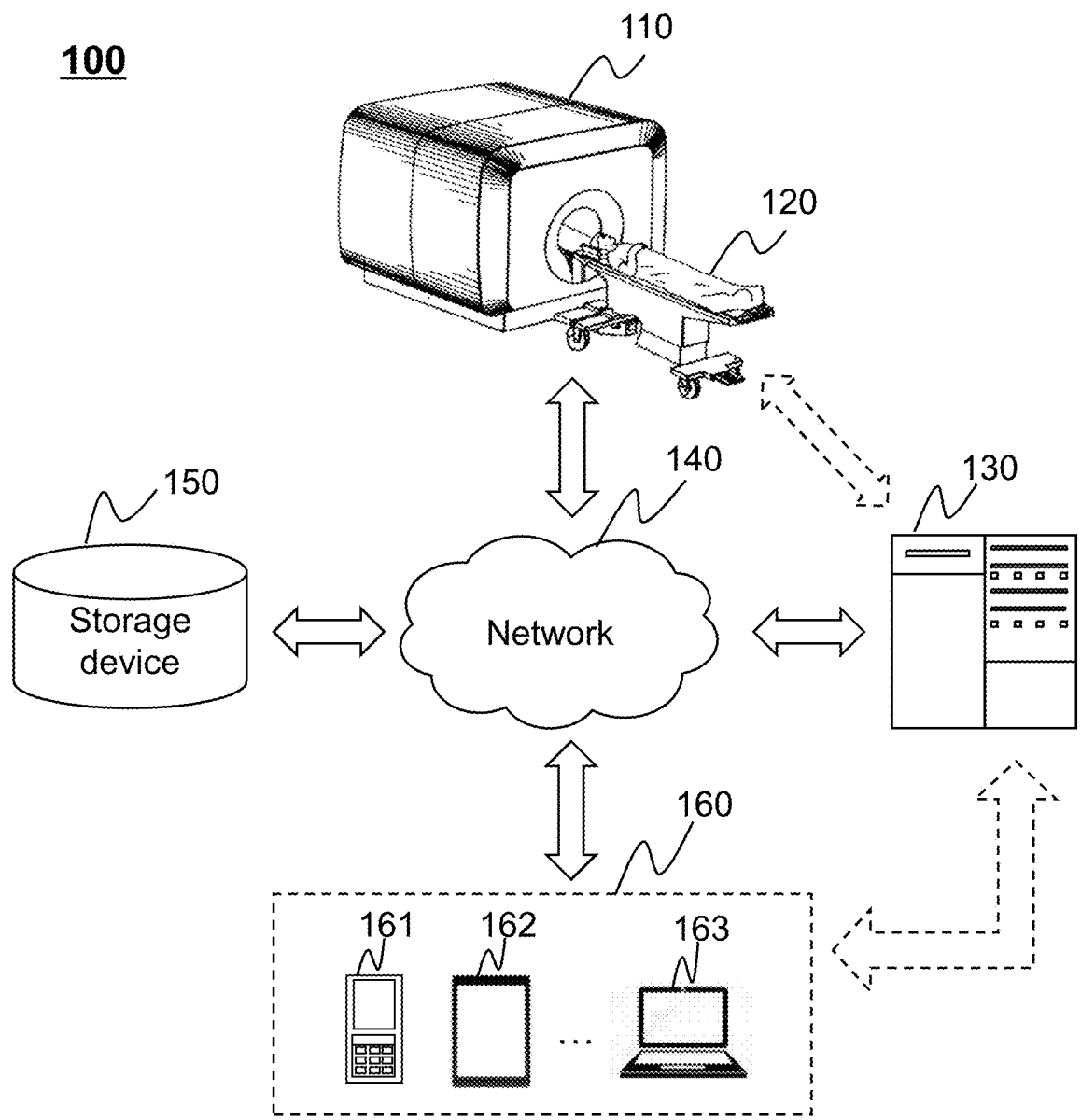
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As shown in FIG. 1, the MRI system 100 may include an MRI scanner 110, an examining table 120, a processing engine 130, a network 140, a storage device 150, and one or more terminals 160.

The MRI scanner 110 may generate or provide imaging data associated with MR signal via scanning a subject, or a part of the subject. In some embodiments, the MRI scanner 110 may include, for example, a magnetic body 220, one or more gradient coils 230, one or more radiofrequency (RF) coils 240, etc., as described in connection with FIG. 2. In some embodiments, the MRI scanner 110 may be a permanent magnet MRI scanner, a superconducting electromagnet MRI scanner, or a resistive electromagnet MRI scanner, etc., according to types of the magnetic body 220. In some embodiments, the MRI scanner 110 may be a high-field MRI scanner, a mid-field MRI scanner, and a low-field MRI scanner, etc., according to the intensity of the magnetic field. In some embodiments, the MRI scanner 110 may be of a closed-bore (cylindrical) type, an open-bore type, or the like.

In some embodiments, the subject may be placed on the examining table 120 during scanning. The examining table 120 may be sent into the MRI scanner 110 during scanning. In some embodiments, the subject may include a body, a substance, an object, or the like, or any combination thereof. In some embodiments, the subject may include a specific portion of a body, a specific organ, or a specific tissue, such as head, brain, neck, body, shoulder, arm, thorax, cardiac, stomach, blood vessel, soft tissue, knee, feet, or the like, or any combination thereof. In some embodiments, the subject may be a human patient. The human patient may lie on the back, lie in prone, lie on the side on the examining table 120. In some embodiments, the MRI scanner 110 may transmit the imaging data via the network 140 to the processing engine 130, the storage device 150, and/or the terminal 160. For example, the imaging data may be sent to the processing engine 130 for further processing, or may be stored in the storage device 150.

The processing engine 130 may process data and/or information obtained from the MRI scanner 110, the storage device 150, and/or the terminal 160. For example, the processing engine 130 may process imaging data and determine an MRI image based on the imaging data. In some embodiments, the processing engine 130 may be a single server or a server group. The server group may be centralized or distributed. In some embodiments, the processing engine 130 may be local or remote. For example, the processing engine 130 may access information and/or data stored in the MRI scanner 110, the storage device 150, and/or the terminal 160 via the network 140. As another example, the processing engine 130 may be directly connected to the MRI scanner 110, the terminal 160 and/or the storage device 150 to access stored information and/or data. In some embodiments, the processing engine 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing engine 130 may be implemented by a computing device 300 having one or more components as illustrated in FIG. 3.

The network 140 may include any suitable network that can facilitate exchange of information and/or data for the MRI system 100. In some embodiments, one or more components of the MRI system 100 (e.g., the MRI scanner 110, the processing engine 130, the storage device 150, the terminal 160, etc.) may communicate information and/or data with one or more other components of the MRI system 100 via the network 140. For example, the processing engine 130 may obtain imaging data from the MRI scanner 110 via the network 140. As another example, the processing engine 130 may obtain user instructions from the terminal 160 via the network 140. The network 140 may be and/or include a public network (e.g., the Internet), a private network (e.g., a local area network (LAN), a wide area network (WAN), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, witches, server computers, or any combination thereof. Merely by way of example, the network 140 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 140 may include one or more network access points. For example, the network 140 may include wired and/or wireless network access points such as base stations and/or internet exchange points through which one or more components of the MRI system 100 may be connected to the network 140 to exchange data and/or information.

The storage device 150 may store data, instructions, and/or any other information. In some embodiments, the storage device 150 may store data obtained from the terminal 160 and/or the processing engine 130. In some embodiments, the storage device 150 may store data and/or instructions that the processing engine 130 may execute or use to perform exemplary methods described in the present disclosure. In some embodiments, the storage device 150 may include a mass storage, a removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 140 to communicate with one or more other components in the MRI system 100 (e.g., the processing engine 130, the terminal 160, etc.). One or more components in the MRI system 100 may access the data or instructions stored in the storage device 150 via the network 140. In some embodiments, the storage device 150 may be directly connected to or communicate with one or more other components in the MRI system 100 (e.g., the processing engine 130, the terminal 160, etc.). In some embodiments, the storage device 150 may be part of the processing engine 130.

The terminal 160 may include a mobile device 161, a tablet computer 162, a laptop computer 163, or the like, or any combination thereof. In some embodiments, the mobile device 161 may include a smart home device, a wearable device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistance (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 160 may be part of the processing engine 130.

It should be noted that the above description of the MRI system 100 is merely provided for the purposes of illustration, and not intended to limit the scope of the present disclosure. For persons having ordinary skills in the art, multiple variations and modifications may be made under the teachings of the present disclosure. For example, the assembly and/or function of the MRI system 100 may be varied or changed according to specific implementation scenarios. Merely by way of example, some other components may be added into the MRI system 100, such as a patient positioning unit, a gradient amplifier unit, and other devices or units. Note that the MRI system may be a traditional or a single-modality medical system, or a multi-modality system including, e.g., a positron emission tomography-magnetic resonance imaging (PET-MRI) system, a computed tomography-magnetic resonance imaging (CT-MRI) system, a remote medical MRI system, etc. However, those variations and modifications do not depart from the scope of the present disclosure.

Figure 2:
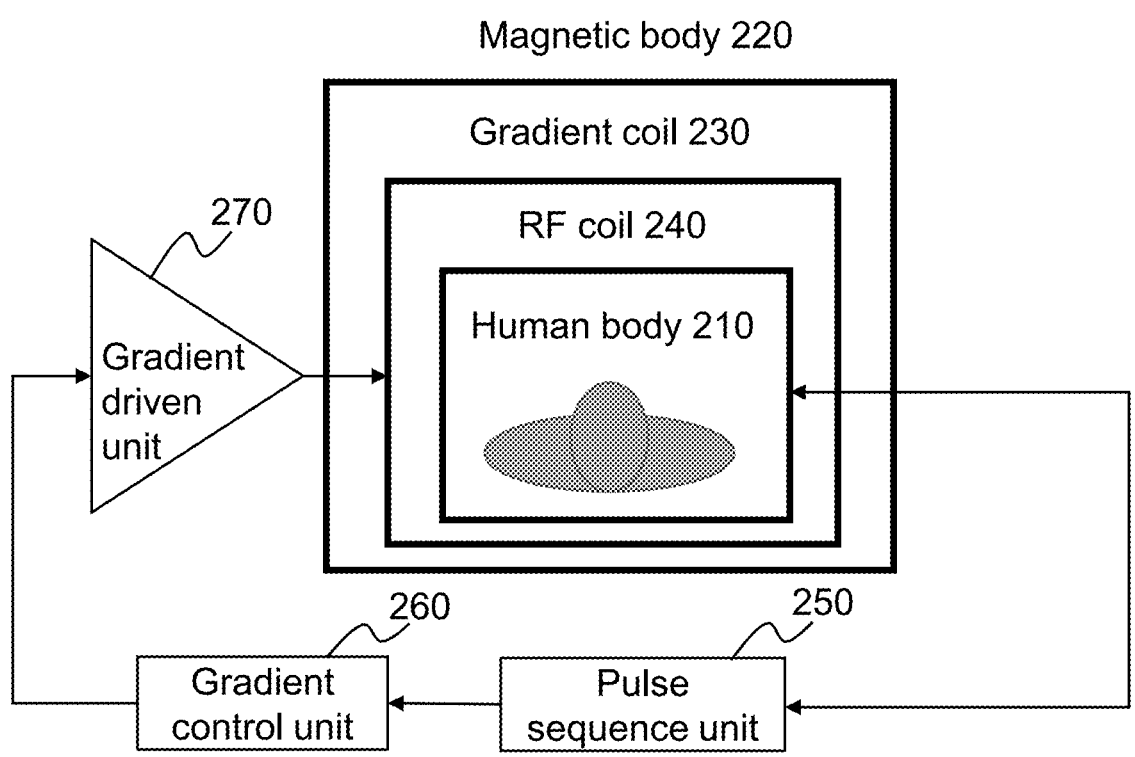
FIG. 2 is a block diagram illustrating an exemplary MRI scanner according to some embodiments of the present disclosure.

FIG. 2 is a block diagram illustrating an exemplary MRI scanner according to some embodiments of the present disclosure. As shown in FIG. 2, the MRI scanner 110 may include a magnetic body 220, a gradient coil 230, an RF coil 240, a pulse sequence unit 250, a gradient control unit 260, and a gradient driven unit 270. In some embodiments, a human body 210 may be placed in the MRI scanner 110 during scanning.

The magnetic body 220 may generate a static magnetic field BO during an MRI process. The magnetic body 220 may be of various types including, for example, a permanent magnet, a superconducting electromagnet, a resistive electromagnet, etc.

The gradient coil 230 may generate magnetic field gradients to the main magnetic field BO in the X, Y, and/or Z directions (or axes). In some embodiments, the gradient coil 230 may include an X-direction coil (or axis), a Y-direction coil (or axis), a Z-direction coil (or axis), etc. For example, the Z-direction coil may be designed based on circular (Maxwell) coil, while the X-direction coil and the Y-direction coil may be designed on the basis of the saddle (Golay) coil configuration. In some embodiments, the X direction may be also referred to as the readout (RO) direction (or a frequency encoding direction), the Y direction may be also referred to the phase encoding (PE) direction, the Z direction may be also referred to the slice selecting encoding (SPE) direction. In the present disclosure, the readout direction and the frequency encoding direction may be used interchangeably.

The RF coil 240 may emit RF pulse signals to and/or receive MRI data from a human body 210 being examined. In some embodiments, the RF coil 240 may include an RF transmitting coil and an RF receiving coil. The RF transmitting coil may emit RF pulse signals that may excite the nucleus in the human body 210 to resonate at the Larmor frequency. The RF receiving coil may receive MRI data emitted from the human body 210. In some embodiments, the RF transmitting coil and RF receiving coil may be integrated into one single coil, for example, a transmitting/receiving coil. The RF coil 240 may be of various types including, for example, a QD orthogonal coil, a phase-array coil, a specific element spectrum coil, etc. In some embodiments, the RF coil 240 may be different according to different parts of a body being examined, for example, a head coil, a knee joint coil, a cervical vertebra coil, a thoracic vertebra coil, a temporomandibular joint (TMJ) coil, etc. In some embodiments, according to function and size, the RF coil 240 may include but not limited to a volume coil, a local coil, a birdcage coil, a transverse electromagnetic coil, a surface coil, a saddle coil, a solenoid coil, a saddle coil, a flexible coil, or the like, or any combination thereof.

The pulse sequence unit 250 may determine a pulse sequence. The pulse sequence unit 250 may have several portions including, for example, an RF pulse sub-unit, an ADC sub-unit indicating timing for data acquisition, a group of gradients in X, Y, Z axes for spatial encoding or selection, or the like, or any combination thereof.

The pulse sequence unit 250 may be defined by imaging gradient parameters and arrangement in time sequence corresponding to the imaging gradient parameters. In some embodiments, the imaging gradient parameters may include parameters related to an RF pulse emitted by the RF coil 240, the parameters related to gradient fields generated by the gradients coil 230, and the time for collecting MRI data. The different portions of the pulse sequence unit 250 (e.g., the RF pulse), may refer to different imaging gradient parameters. For example, the parameters related to an RF pulse may include, for example, a bandwidth (also referred to as a frequency range), an amplitude or strength, a time for applying the RF pulse, a duration for applying the RF pulse, etc. The parameters related to the imaging gradient may include an amplitude value of the gradient pulses, a duration of an imaging gradient, a starting time for applying an imaging gradient, an ending time for applying an imaging gradient, etc. The parameters related to the MRI data may include MRI data types, a number of echoes, centers of the echoes, time of echoes, etc.

In some embodiments, the pulse sequence unit 250 may be a free-induction decay (FID) sequence, a spin echo (SE) sequence, a fast spin echo (FSE), a gradient echo (GRE) sequence, a fast imaging with steady-state precession (FISP) sequence, or the like, or any combination thereof.

In some embodiments, the pulse sequence unit 250 may be connected to and/or communicate with the processing engine 130. For example, before an MRI scanning process, at least one portion of the pulse sequence unit 250 (e.g., the RF pulse, the imaging gradient) may be designed and/or determined by the processing engine 130 according to clinical demands or a scanning protocol. In the MRI scanning process, the RF coil 240 may emit RF pulses with specific parameters related to the RF pulse of the pulse sequence unit 250, and receive MRI data. The gradient control unit 260 may control the gradient driven unit 270 to drive the gradient coil 230 by gradient pulses with specific parameters related to the imaging gradient of the pulse sequence unit 250. The gradient fields generated by the gradient coil 230 may encode the MRI data. The encoded MRI data may be transmitted to the processing engine 130 for determining an MRI image.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the MRI scanner 110 may include a transmitting channel and/or a receiving channel for transmitting and receiving information (e.g., RF pulse). However, those variations and modifications do not depart the scope of the present disclosure.

FIG. 3 is a schematic diagram illustrating exemplary hardware and/or software components of an exemplary computing device on which the processing engine 130 may be implemented according to some embodiments of the present disclosure. As illustrated in FIG. 3, the computing device 300 may include a processor 310, a storage 320, an input/output (I/O) 330, and a communication port 340.

The processor 310 may execute computer instructions (e.g., program code) and perform functions of the processing engine 130 in accordance with techniques described herein. The computer instructions may include, for example, routines, programs, objects, components, data structures, procedures, modules, and functions, which perform particular functions described herein. For example, the processor 310 may process imaging data obtained from the MRI scanner 110, the terminal 160, the storage device 150, and/or any other component of the MRI system 100. In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 300. However, it should be noted that the computing device 300 in the present disclosure may also include multiple processors, thus operations and/or method steps that are performed by one processor as described in the present disclosure may also be jointly or separately performed by the multiple processors. For example, if in the present disclosure the processor 310 of the computing device 300 executes both step A and step B, it should be understood that step A and step B may also be performed by two or more different processors jointly or separately in the computing device 300 (e.g., a first processor executes step A and a second processor executes step B, or the first and second processors jointly execute steps A and B).

The storage 320 may store data/information obtained from the MRI scanner 110, the terminal 160, the storage device 150, and/or any other component of the CT system 100. In some embodiments, the storage 320 may include a mass storage, a removable storage, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing engine 130 for determining a regularization item.

The I/O 330 may input and/or output signals, data, information, etc. In some embodiments, the I/O 330 may enable a user interaction with the processing engine 130. In some embodiments, the I/O 330 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 340 may be connected to a network (e.g., the network 140) to facilitate data communications. The communication port 340 may establish connections between the processing engine 130 and the MRI scanner 110, the terminal 160, and/or the storage device 150. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Those skilled in the art will recognize that the present teachings are amenable to a variety of modifications and/or enhancements. For example, although the implementation of various components described herein may be embodied in a hardware device, it may also be implemented as a software only solution, for example, an installation on an existing server. In addition, the processing engine 130 as disclosed herein may be implemented as a firmware, firmware/software combination, firmware/hardware combination, or a hardware/firmware/software combination.

Figure 4:
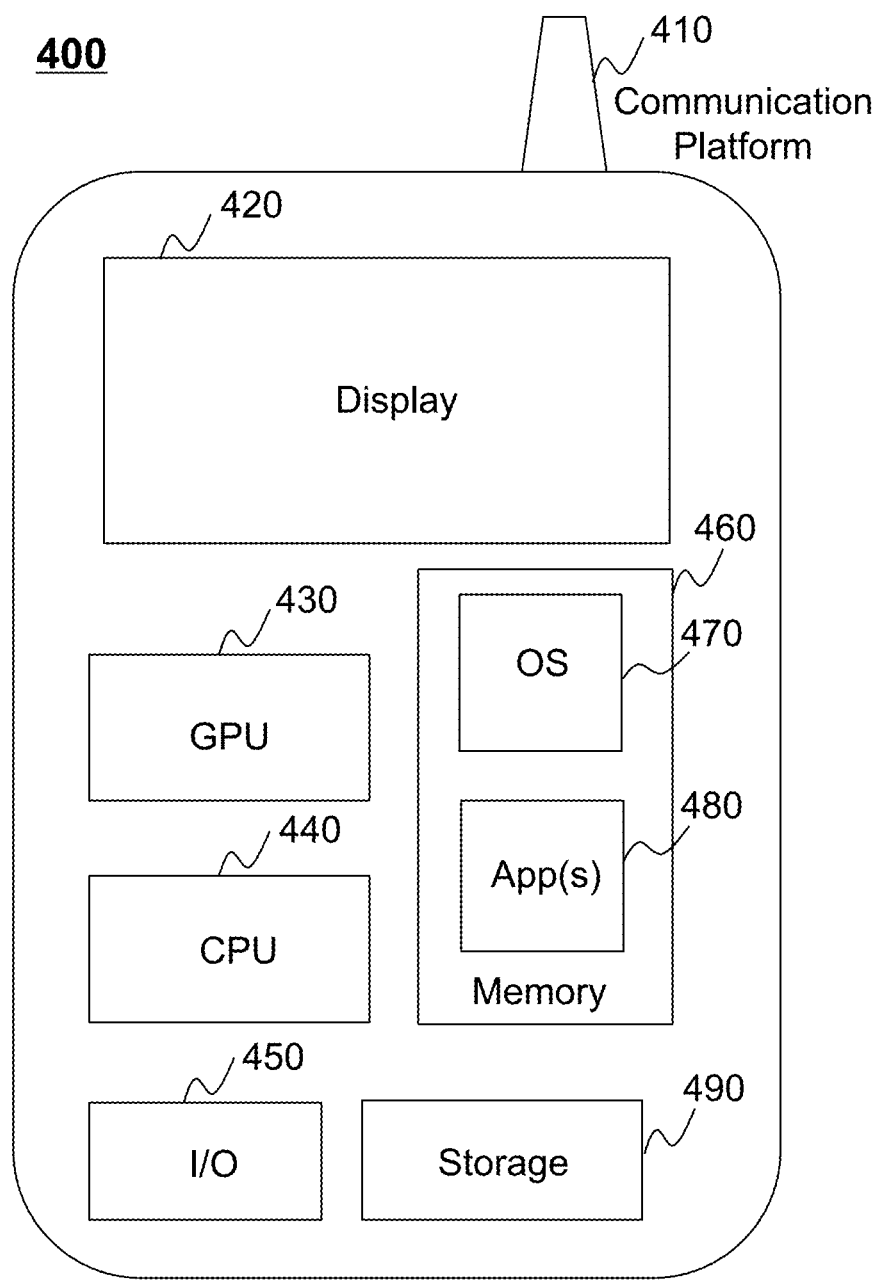
FIG. 4 is a schematic diagram illustrating exemplary hardware and/or software components of an exemplary mobile device according to some embodiments of the present disclosure.

FIG. 4 is a schematic diagram illustrating exemplary hardware and/or software components of an exemplary mobile device on which the terminal 160 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including a system bus or a controller (not shown), may also be included in the mobile device 400. In some embodiments, a mobile operating system 470 (e.g., iOS™, Android™, Windows Phone™, etc.) and one or more applications 380 may be loaded into the memory 460 from the storage 490 in order to be executed by the CPU 440. The applications 480 may include a browser or any other suitable mobile apps for receiving and rendering information relating to image processing or other information from the processing engine 130. User interactions with the information stream may be achieved via the I/O 450 and provided to the processing engine 130 and/or other components of the MRI system 100 via the network 140.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 5:
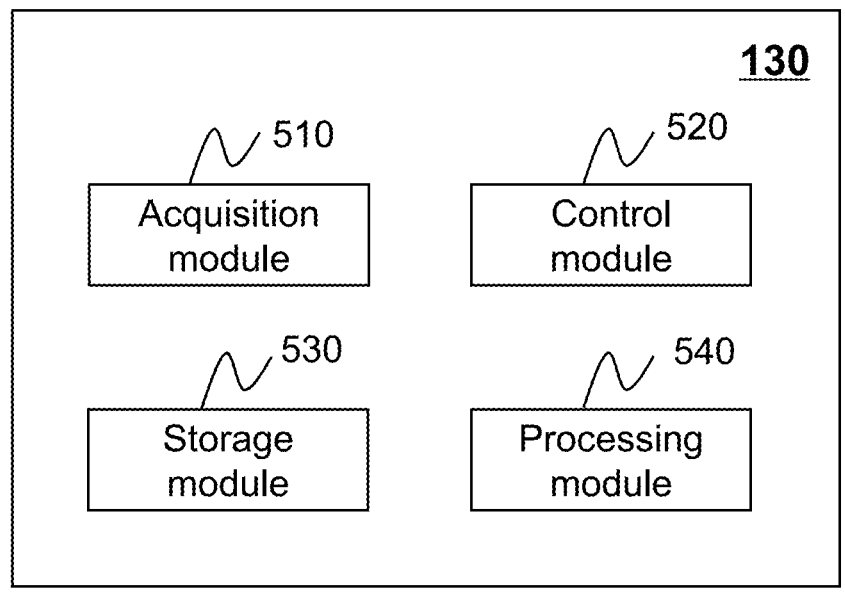
FIG. 5 is a block diagram illustrating an exemplary processing engine according to some embodiments of the present disclosure.

FIG. 5 is a block diagram illustrating an exemplary processing engine according to some embodiments of the present disclosure. The processing engine 130 may include an acquisition module 510, a control module 520, a storage module 530, and a processing module 540. In some embodiments, the acquisition module 510, the control module 520, the storage module 530, and/or the processing module 540 may be connected to and/or communicate with each other via a wired connection, a wireless connection, or any combination thereof. At least a part of the processing engine 130 may be implemented on the computing device 300 as illustrated in FIG. 3 or the mobile device 400 as illustrated in FIG. 4.

The acquisition module 510 may acquire data. In some embodiments, the data may be acquired from the MRI scanner 110, the examining table 120, the storage device 150, and/or the terminal 160. In some embodiments, the data may include a scanning protocol, a scanning plan, MRI data (or imaging data), instructions, or the like, or any combination thereof. The instructions may be executed by the processor(s) of the processing engine 130 to perform exemplary methods described in the present disclosure. In some embodiments, the data may be transmitted to the processing module 540 for further processing, or stored in the storage module 530.

The control module 520 may control operations of the acquisition module 510, the MRI scanner 110, the examining table 120, the storage module 530, and/or the processing module 540 (e.g., by generating one or more control parameters). For example, the control module 520 may control the acquisition module 510 to acquire data. As another example, the control module 520 may control the movement of the examining table 120. As still another example, the control module 520 may control the processing module 540 to process the MRI data acquired by the acquisition module 510. In some embodiments, the control module 520 may receive a real-time command or retrieve a predetermined command provided by a user (e.g., a doctor) to control one or more operations of the acquisition module 510 and/or the processing module 540. For example, the control module 520 may adjust the acquisition module 510 and/or the processing module 540 to generate images of a subject according to the real-time command and/or the predetermined command. In some embodiments, the control module 520 may communicate with one or more other modules of the processing engine 130 for exchanging information and/or data.

The storage module 530 may store MRI data, control parameters, processed MRI data, or the like, or any combination thereof. In some embodiments, the storage module 530 may store one or more scanning protocols and/or encoded MRI data. In some embodiments, the storage 530 may store one or more programs and/or instructions that may be executed by the processor(s) of the processing engine 130 to perform exemplary methods described in this disclosure. For example, the storage 530 may store program(s) and/or instruction(s) that can be executed by the processor(s) of the processing engine 130 to acquire MRI data, reconstruct an MRI image based on the MRI data, and/or display any intermediate result or a resultant image.

The processing module 540 may process data provided by various modules of the processing engine 130. The processing module 540 may process MRI data acquired by the acquisition module 510, MRI data retrieved from the storage module 430, etc. In some embodiments, the processing module 540 may determine an MRI scanning plan according to a plane of k-space, reconstruct MRI images based on the MRI data according to a reconstruction algorithm, generate reports including one or more MRI images and/or other related information, and/or perform any other function for image reconstruction in accordance with various embodiments of the present disclosure.

In some embodiments, one or more modules illustrated in FIG. 5 may be implemented in at least a part of the exemplary MRI system as illustrated in FIG. 1. For example, the acquisition module 510, the control module 520, the storage module 530, and/or the processing module 540 may be integrated into a console (not shown). Via the console, a user may set parameters for scanning an object, controlling imaging processes, controlling parameters for reconstruction of an image, viewing reconstructed images, etc. In some embodiments, the console may be implemented via the processing engine 130 and/or the terminal 160.

Figure 6:
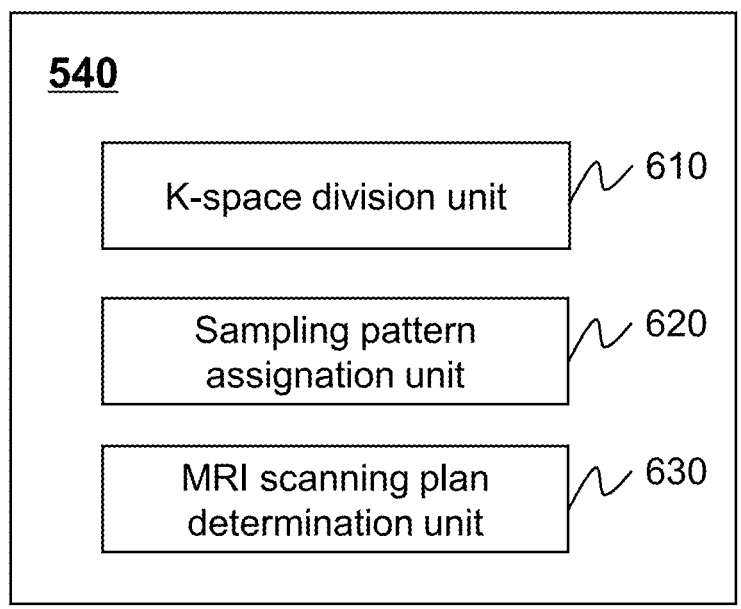
FIG. 6 is a block diagram illustrating an exemplary processing module according to some embodiments of the present disclosure.

FIG. 6 is a block diagram illustrating an exemplary processing module according to some embodiments of the present disclosure. As shown in FIG. 6, the processing module 540 may include a k-space division unit 610, a sampling pattern assignation unit 620, and an MRI scanning plan determination unit 630. At least a part of the processing module 540 may be implemented on the computing device 300 as illustrated in FIG. 3 or the mobile device 400 as illustrated in FIG. 4.

The k-space division unit 610 may divide a plane of a k-space into several regions. A region of the plane may be assigned one or more sampling patterns. In some embodiments, the region may be one continuous section or at least two separated sections. As used herein, a section is considered continuous if the section is defined by a continuous boundary. As used herein, two sections are considered separate if the two sections do not share at least part of their respective boundaries. The boundaries of two separate sections are not continuous.

Figure 9:
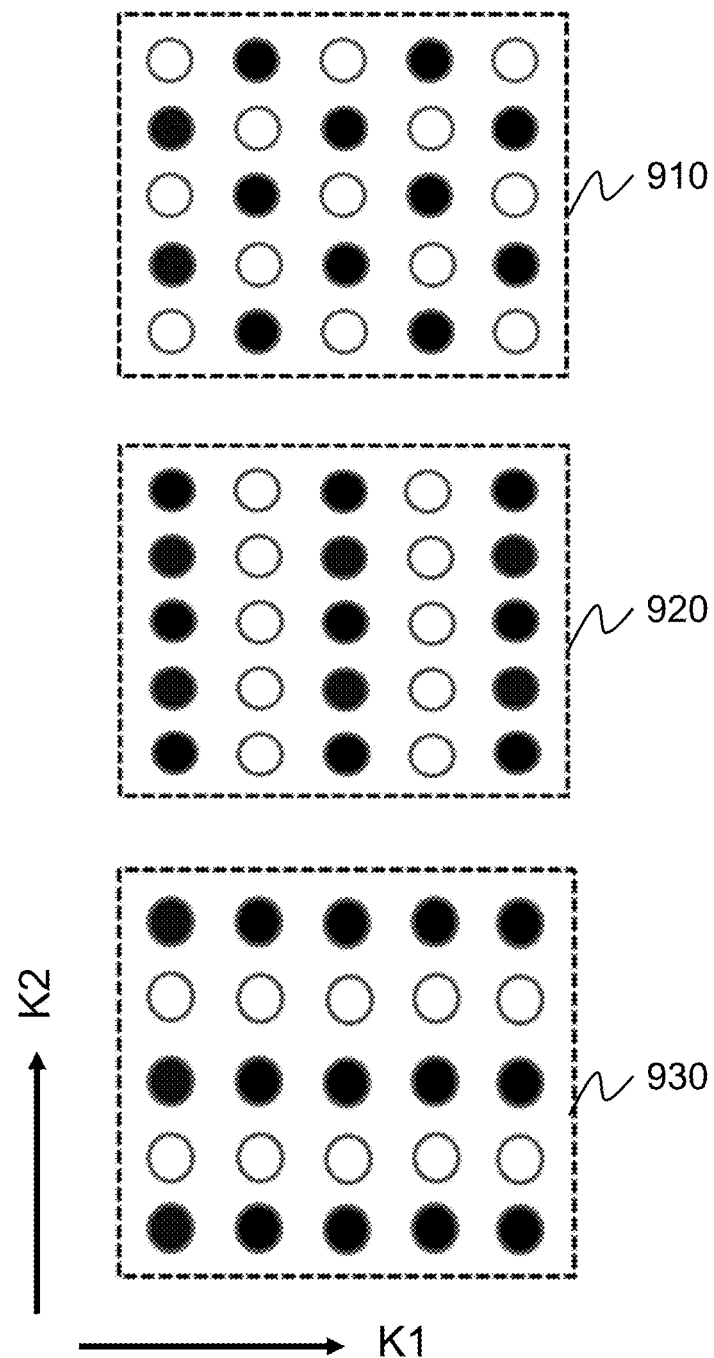
FIG. 9 is a schematic diagram illustrating an exemplary regular undersampling pattern according to some embodiments of the present disclosure.
Figure 10:
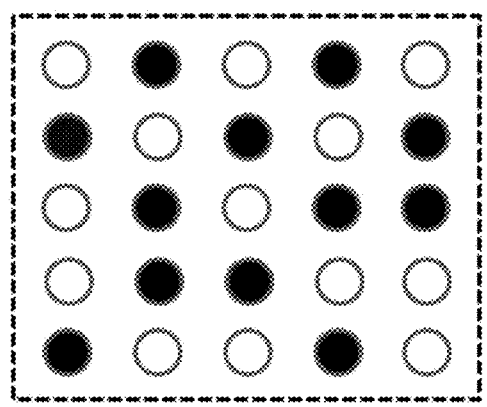
FIG. 10 is a schematic diagram illustrating an exemplary random undersampling pattern according to some embodiments of the present disclosure.
Figure 11:
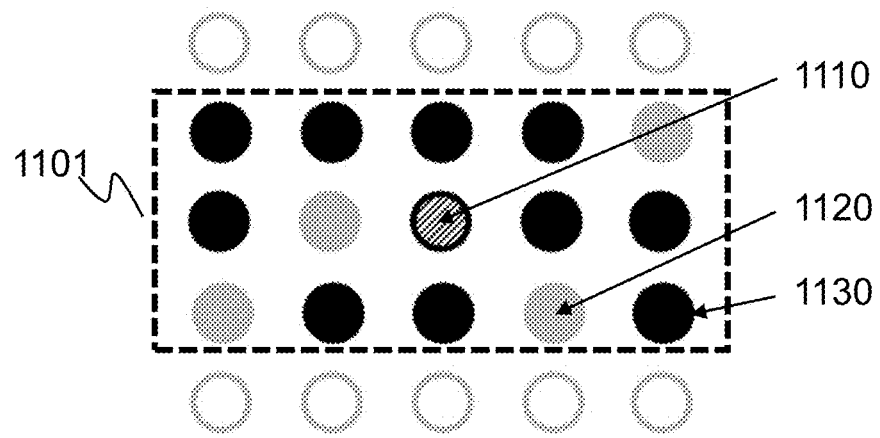
FIG. 11 is a schematic diagram illustrating an exemplary restrained undersampling pattern according to some embodiments of the present disclosure.

In some embodiments, the k-space may be a 2D or 3D Fourier transform of an MRI image or MRI imaging data. Values of the k-space may be acquired during an MRI scanning performed according to a premeditated scheme controlled by a pulse sequence (e.g., an accurately timed sequence of radiofrequency and gradient pulses). In some embodiments, the values of the k-space may be described as a plurality of data points (hereinafter referred to as "points") as shown in FIGS. 9-11. After the k-space is filled (e.g., at the end of the scanning), the data points in the k-space may be mathematically processed to produce a reconstruction image. In some embodiments, the k-space may include a first direction K1 and a second direction K2. The first direction K1 or the second direction K2 may refer to a phase encoding (PE) direction.

The sampling pattern assignation unit 620 may assign the region in the plane of a k-space a sampling pattern. Exemplary sampling patterns may include a full sampling pattern, an undersampling pattern, etc. Exemplary undersampling patterns may include a regular undersampling pattern and an irregular undersampling pattern. Exemplary irregular underdamping pattern may include a random undersampling pattern, a restrained undersampling pattern, or the like, or any combination thereof. When a region is assigned a full sampling pattern, then all or approximately all points in the region may be sampled. When a region is assigned an undersampling pattern, then a sampling density (or sampling rate) of the region may be determined. The sampling density may be a value ranging from 0 to 1, e.g., 10%, 20%, 30%, etc. Merely by way of example, the sampling density may be expressed as a ratio of N and M. N and M may be positive integers, and N is no greater than M.

The MRI scanning plan determination unit 630 may determine an MRI scanning plan according to the plane of the k-space. In some embodiments, the MRI scanning plan determination unit 630 may determine the MRI scanning plan based on the division of the plane of the k-space and the assigned sampling pattern of each region of the plane. The MRI scanning plan may be implemented by the MRI system 100. For example, the MRI scanning plan may be implemented as a set of instructions (e.g., an application) stored in the storage device 150 and/or the storage module 530 in the processing engine. The MRI scanner 110 may execute the set of instructions and may accordingly be directed to perform an MRI scan according to the MRI scanning plan.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the k-space division unit 610 and the sampling pattern assignation unit 620 may be integrated into one single unit. However, those variations and modifications do not depart the scope of the present disclosure.

Figure 7:
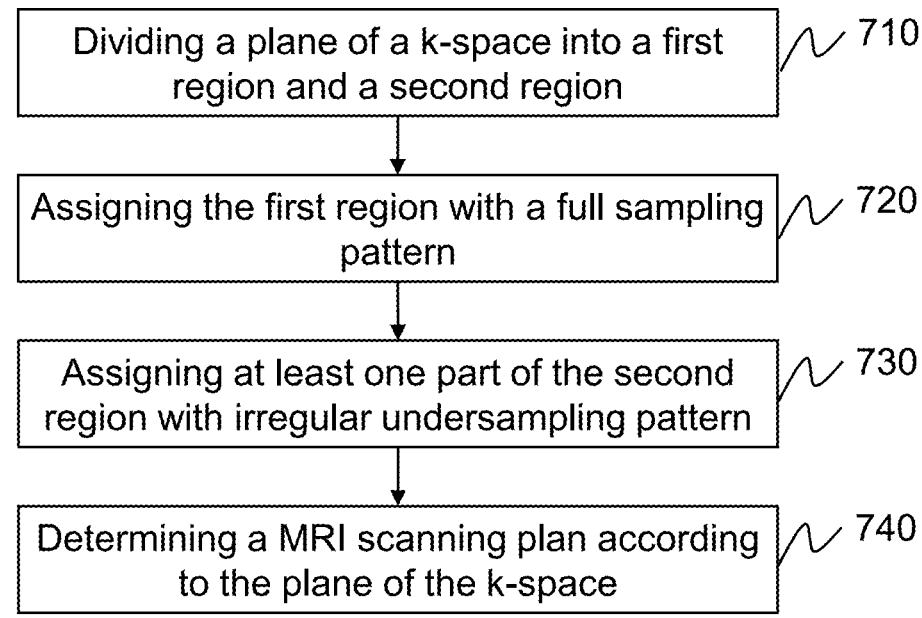
FIG. 7 is a flowchart illustrating an exemplary process for determining an MRI scanning plan according to some embodiments of the present disclosure.

FIG. 7 is a flowchart illustrating an exemplary process for determining an MRI scanning plan according to some embodiments of the present disclosure. As shown in FIG. 7, the process 700 for determining an MRI scanning plan may be executed by the MRI system 100. For example, the process 700 may be implemented as a set of instructions (e.g., an application) stored in the storage device 150 and/or the storage module 530 in the processing engine 130. The processing engine 130 may execute the set of instructions and may accordingly be directed to perform the process 700 in the MRI system 100. At least a portion of the processing engine 130 may be implemented on the computing device 300 as illustrated in FIG. 3 or the mobile device 400 as illustrated in FIG. 4.

In 710, a plane of a k-space may be divided into a first region and a second region. In some embodiments, the plane of the k-space may be divided by the k-space division unit 610 as shown in FIG. 6. In some embodiments, the first region may be located in the center section of the plane. And the second region may be located in the surrounding section of the plane. In some embodiments, the area of the first region may be determined based on a feature. Exemplary features may include Nyquist sampling theorem, a desired number of voxels, a desired field of view (FOV), the amount of data needed for determining coil sensitivities or calibration in parallel imaging, the amount of data needed for extracting the image phase, or the like, or any combination thereof.

In 720, the first region may be assigned a full sampling pattern. For instance, the sampling pattern of the first region may be assigned by the sampling pattern assignation unit 620 as shown in FIG. 6. With the full sampling pattern, all, or approximately all, points in the first region may be sampled.

In 730, at least one part of the second region may be assigned an irregular undersampling pattern. In some embodiments, the sampling pattern of the at least one part of the second region may be assigned by the sampling pattern assignation unit 620 as shown in FIG. 6. In some embodiments, the second region may be divided into several parts, and at least one part of the second region may be assigned an irregular undersampling pattern. Exemplary irregular undersampling patterns may include a random undersampling pattern, a restrained undersampling pattern, or the like, or any combination thereof. More details of the random undersampling pattern may be found in, for example, FIG. 10 and the description thereof. More details of the restrained undersampling pattern may be found in, for example, FIG. 11 and the description thereof.

In 740, an MRI scanning plan may be determined according to the plane of the k-space. In some embodiments, the MRI scanning plan may be determined by the MRI scanning plan determination unit 630 as shown in FIG. 6. The MRI scanning plan may be a sampling plan executed by the MRI system 100. The MRI scanning plan may include a number of regions of the plane, the relative positions of the region(s) in the plane, the sampling pattern of a region of the plane, the sampling rate of a region of the plane, or the like, or any combination thereof.

Figure 8:
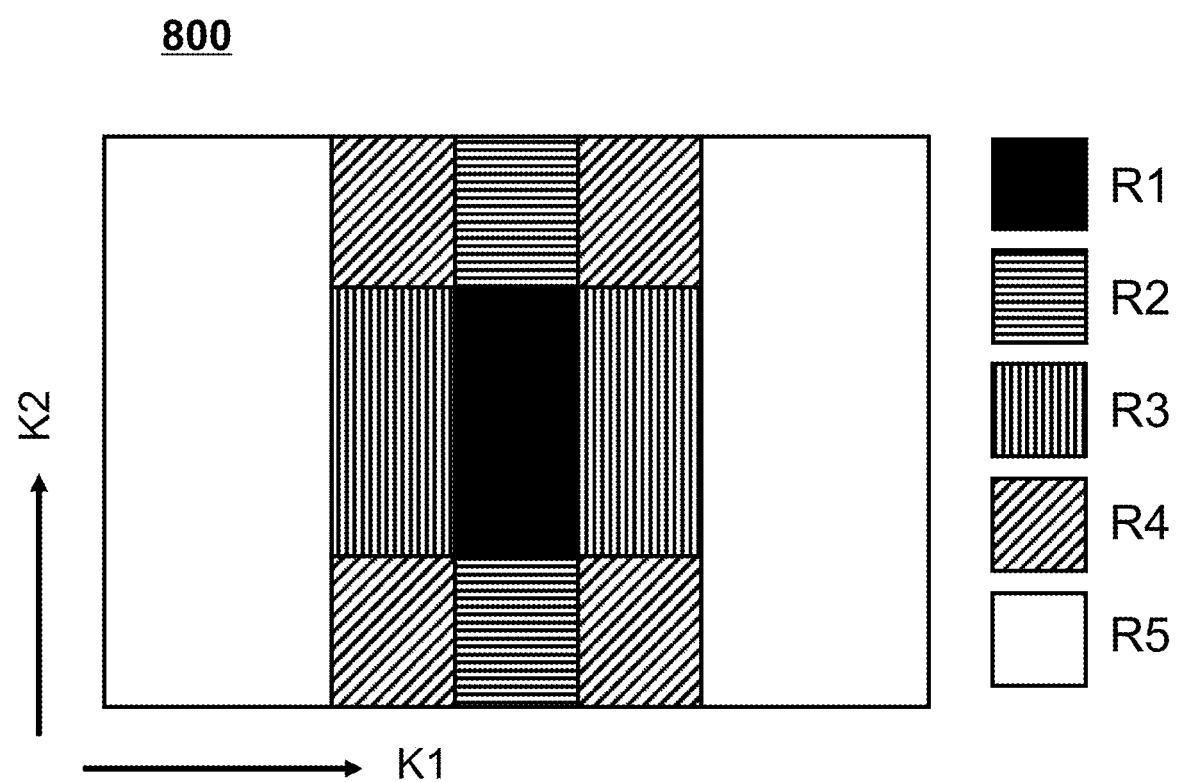
FIG. 8 is a schematic diagram illustrating an exemplary MRI scanning plan according to some embodiments of the present disclosure.

FIG. 8 is a schematic diagram illustrating an exemplary MRI scanning plan according to some embodiments of the present disclosure. As shown in FIG. 8, a plane of the k-space 800 may be divided into regions including, for example, R1 as illustrated as the black block, R2 as illustrated as the two blocks located at the top center and the bottom center and filled with horizontal lines, R3 as illustrated as the two blocks located at the left center and the right center and filled with vertical lines, R4 as illustrated as the four blocks located by the sides of R2 and filled with hatch lines, and R5 as illustrated as the two open blocks at the left side and the right side of the plane. The region R1 may be located in the center of the plane, the region R2 may be located along two sides of the region R1 in a second direction K2. The region R3 may be located along two sides of the region R1 in a first direction K1. The region R4 may be located along two sides of the region R2 in the first direction K1. The region R5 may occupy the remaining sections of the plane. In some embodiments, the regions may be rectangular. In some embodiments, the length of the region R2 in the second direction K2 may be approximately equal to the length of the region R4 in the second direction K2. The length of the region R2 in the first direction K1 may be approximately equal to the length of the region R4 in the first direction K1. In some embodiments, there may lack a clear boundary or dividing line between the five regions. It should be noted that this description is intended to be illustrative, and not to limit the scope of the present disclosure. The plane of the k-space may be divided in different ways. For example, the plane of the k-space may be divided into 4 regions, 6 regions, etc.

In some embodiments, the region R1 may be the first region and assigned the full sampling pattern. The second region may include the regions R2, R3, R4, and R5. One of the regions R2, R3, R4, and R5 may be assigned an irregular undersampling pattern. One of the regions R2, R3, R4, and R5 may be assigned a regular undersampling pattern. In some embodiments, the sampling density (or the sampling rate) of the regions R1, R2, R3, and R4 may be uniform. For example, the sampling density of one part in the region R1 (or R2, R3, R4) may be same with other part in the region R1 (or R2, R3, R4). The sampling density (or the sampling rate) of the region R5 may be uniform or non-uniform. For example, the sampling density of one part of the region R5 may be same or different with other part in the region R5. The sampling density may be determined by the ratio of the number of points to be sampled in a region to the number of points in the region. In some embodiments, the sampling density of the region R1 may be greater than the sampling density of the region R2. For example, the sampling density of the region R2 may be 10-90% of the sampling density of the region R1. In some embodiments, the sampling density of the region R2 may be to 30-70% of the sampling density of the region R1. In some embodiments, the sampling density of the region R2 may be 50% of the sampling density of the region R1. The sampling density of the region R3 may be greater than the region R4. In some embodiments, the sampling density of the region R4 may be 30-90% of the sampling density of the region R3. In some embodiments, the sampling density of the region R4 may be 50-70% of the sampling density of the region R3. In some embodiments, the sampling density of the region R4 may be 60% of the sampling density of the region R3.

FIG. 9 is a schematic diagram illustrating an exemplary regular undersampling pattern according to some embodiments of the present disclosure. In some embodiments, the sampling density (or the sampling rate) of the regular undersampling pattern may be 1/R, R may be a positive integer greater than 1. As shown in FIG. 9, exemplary regular undersampling patterns 910, 920, and 930 are provided. A circle, either an open circle or a solid circle, may represent a point in the plane of k-space. An open circle illustrates a point that is not sampled. A solid circle illustrates a point that is sampled. In some embodiments, the sampling density of regular undersampling patterns 910, 920, and 930 may be equal to a value, for example, 90%, 80%, 70%, 60%, 50%, etc. The regular undersampling pattern 910 may be an interlaced undersampling pattern, in which undersampling may occur both in the first direction K1 and the second direction K2. As illustrated in 910, along the first direction K1, every other point is sampled; along the second direction K2, every other point is sampled. No row or column of points are fully sampled. As illustrated in 920, along the first direction K1, every other column of points may be fully sampled or not sampled at all. As illustrated in 930, along the second direction K2, every other row of points may be fully sampled or not sampled at all. It should be noted that this description is intended to be illustrative, and not to limit the scope of the present disclosure. The regular undersampling pattern may also have different forms. For example, the sampling density of the regular undersampling may include ⅓, ⅕, ⅙, etc.

FIG. 10 is a schematic diagram illustrating an exemplary random undersampling pattern according to some embodiments of the present disclosure. As shown in FIG. 10, the region with the random undersampling pattern may be sampled by the sampling pattern assignation unit 620 randomly. In some embodiments, the probability of a point being sampled may be associated with the sampling density of the region. For example, once the sampling density is determined, the probability of a point being sampled in the region may be equal to or approximately equal to the sampling density. In some embodiments, the sampling density may be set or predetermined by a user or the MRI system 100.

FIG. 11 is a schematic diagram illustrating an exemplary restrained undersampling pattern according to some embodiments of the present disclosure. As illustrated in FIG. 11, the restrained undersampling pattern 1100 may include a restraint region 1101. In the restraint region 1101, a point and one or more points whose positions satisfy a predetermined positional relationship with the point may be selected as unsampled points. For example, as shown in FIG. 11, a point 1110 filled with hatch lines at the central section of the restraint region 1101 may be determined not to be sampled. Based on the determination not to sample the point 1110, some of the points illustrated as solid gray circles whose positions satisfy the predetermined positional relationship (e.g., point 1120, etc.) in the restraint region may be determined not to be sampled accordingly. The remaining points in the restraint region 1101 (e.g., solid black circles such as point 1130) may be sampled with a certain probability as described elsewhere in the present disclosure. The grey open circles outside of the restraint region 1101 may be sampled according to a sampling pattern that is the same as or different from the sampling pattern applied to the restraint region 1101.

The probability may be determined based on a desired sampling density of the restraint region. In some embodiments, the predetermined positional relationship may be set by a user or by the MRI system 100. The predetermined positional relationship of the unsampled points in the restraint region may be determined by the user or by default. In some embodiments, the area or the position of the restraint region may be changed with respect to the restraint region 1101 as shown in FIG. 11. For example, the area of the restraint region may be bigger or smaller. The position of the restraint region in the plane of the k-space may also be changed with respected to the position of the restraint region 1101 as shown in FIG. 11. In some embodiments, the sampling pattern of the restraint region may be determined in a manner different from what is already described. For example, two or more points may be determined not to be sampled at first in the restraint region; afterwards, other points within the restraint region whose positions satisfy the predetermined position relationship may be identified and determined not to be sampled.

Figure 12:
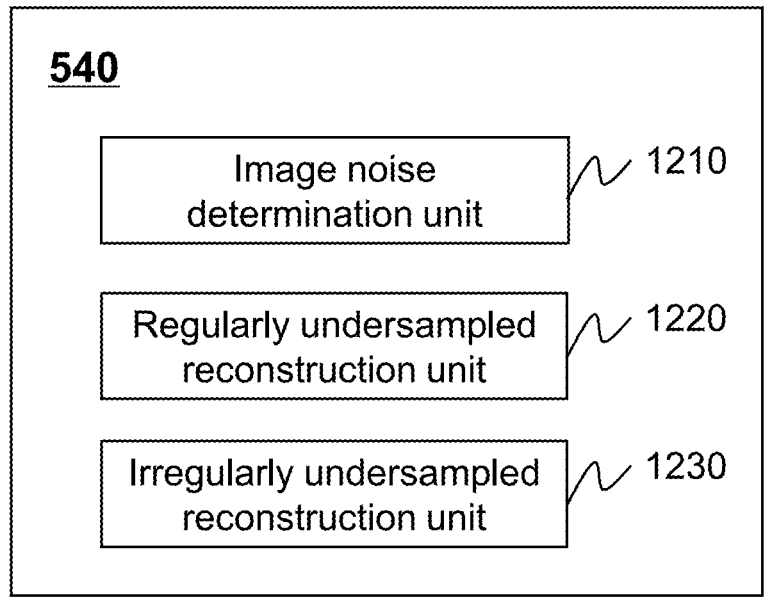
FIG. 12 is a block diagram illustrating an exemplary processing module according to some embodiments of the present disclosure.

FIG. 12 is a block diagram illustrating an exemplary processing module according to some embodiments of the present disclosure. As shown in FIG. 12, the processing module 540 may include an image noise determination unit 1210, a regularly undersampled reconstruction unit 1220, and an irregularly undersampled reconstruction unit 1230. At least a portion of the processing module 540 may be implemented on the computing device 300 as illustrated in FIG. 3, or the mobile device 400 as illustrated in FIG. 4.

The image noise determination unit 1210 may determine image noise of the imaging data. The image noise may include a random variation of brightness or color information in an image. The image noise may be produced by sensors, circuitries of the MRI scanner 110, a data collector (e.g., the RF coil 240), or the like, or any combination thereof. In some embodiments, the image noise may be determined as in FIG. 13 and the description thereof.

The regularly undersampled reconstruction unit 1220 may reconstruct a regularly undersampled region. The irregularly undersampled reconstruction unit 1230 may reconstruct an irregular undersampling region. For example, the MRI signals associated with the regular undersampling region (or the irregular undersampling region) in the plane of the k-space may be processed by the regularly undersampled reconstruction unit 1220 (or the irregularly undersampled reconstruction unit 1230) to generate imaging data or an image. In some embodiments, the reconstruction of an undersampling region may apply a technique including, for example, a Fourier imaging technique, a half-Fourier imaging technique, a parallel imaging technique, a compressed sensing technique, a linear interpolation technique, a Projections onto Convex Sets (POCS) technique, a gradient descent technique, a thresholding technique, or the like, or any combination thereof. More details of the reconstruction of the regular undersampling region and the irregular undersampling region may be found in FIG. 13 and the description thereof.

Figure 13:
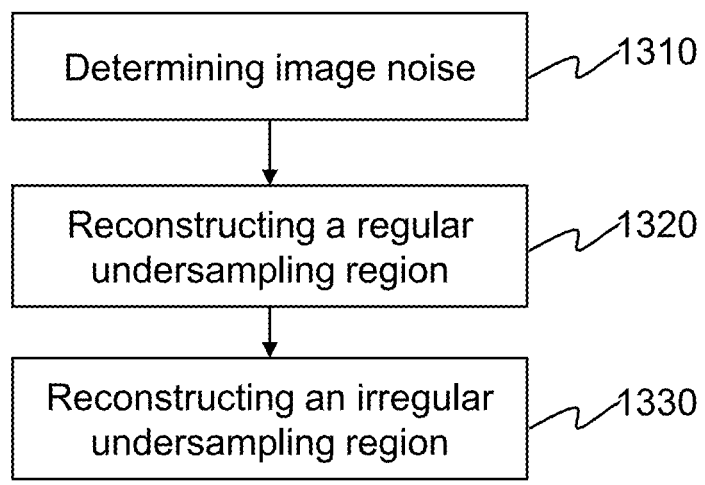
FIG. 13 is a flowchart illustrating an exemplary process for image reconstruction according to some embodiments of the present disclosure.

FIG. 13 is a flowchart illustrating an exemplary process for image reconstruction according to some embodiments of the present disclosure. The process 1300 for reconstructing an MRI image may be executed by the MRI system 100. For example, the process 1300 may be implemented as a set of instructions (e.g., an application) stored in the storage device 150 and/or the storage module 530 in the processing engine 130. The processing engine 130 may execute the set of instructions and may accordingly be directed to perform the process of image reconstruction in the MRI system 100. At least a portion of the process 1300 may be implemented on the computing device 300 as illustrated in FIG. 3 or the mobile device 400 as illustrated in FIG. 4.

In 1310, image noise of the imaging data may be determined. In some embodiments, the imaging data may be obtained from the acquisition module 510. In some embodiments, the imaging data may be acquired by the MRI scanner 110 from a subject according to an MRI scanning plan. The MRI scanning plan may be determined according to a plane of the k-space. For example, the plane of the k-space may be divided into one or more regions and assigned each of the one or more regions with a sampling pattern described as, for example, in FIGS. 7-11. In some embodiments, the image noise of the imaging data may be determined by the image noise determination unit 1210.

In some embodiments, imaging data corresponding to the points on the edge of the k-space, for example, the region R4 and/or R5 illustrated in FIG. 8, may be selected to determine a noise level of the image noise. Merely by way of example, the imaging data may include a plurality of complex numbers expressed as the formula below:

$$p_j = x_j + y_j i, \quad (1)$$

where $p_j$ may represent the value of the jth datum of the imaging data, $x_j$ may represent a real part of the jth datum, and $y_j$ may represent an imaginary part of the jth datum. In some embodiments, j may range from 0 to T, where T may be an integer.

Merely by way of example, the noise level may be determined by the formula below:

$$\text{NoiseLevel} = \sqrt{\Sigma_h (z_h - \bar{z})/(2T-1)}, \quad (2)$$

where $z_h$ may represent a real part of $x_j$ or the imaginary part $y_j$ of the jth datum of the imaging data. $\bar{z}$ may represent a mean value of the all the T real parts $x_j$ and all the T imaginary parts $y_j$ of the imaging data. h may range from 0 to 2T, where T may be an integer.

In some embodiments, the image noise may also be determined by collecting pure noise data without image signals. The pure noise data may be collected with the RF pulses turned off. In a process of collecting the pure noise data, the pulse sequence may be the same as that during the imaging data sampling. For instance, the pure noise data may be expressed as formula (1) above, and the noise level may be determined by the formula below:

$$\text{NoiseLevel} = \sqrt{\Sigma_h (w_h - \bar{w})/(2T-1)}, \quad (3)$$

where $w_h$ may represent a real part of $x_j$ or the imaginary part $y_j$ of the jth datum of the pure noise data. $\bar{w}$ may represent a mean value of the all the T real parts $x_j$ and all the T imaginary parts $y_j$ of the pure noise data. h may range from 0 to 2 T, T may be an integer.

In 1320, a regular undersampling region may be reconstructed. In some embodiments, the reconstruction may be performed by the regularly undersampled reconstruction unit 1220. In some embodiments, 1320 may be optional. For example, if the number of unsampled points in the regular undersampling region is lower than a threshold (e.g., 100, 150, 200, etc.), the regular undersampling region may have no need to be reconstructed.

The regular undersampling region may be reconstructed by a parallel imaging technique. Exemplary parallel imaging techniques may include GeneRalized Autocalibrating Partially Parallel Acquisitions (hereinafter referred to as "GRAPPA"), Sensitivity Encoding (hereinafter referred to as "SENSE"), Iterative Self-Consistent Parallel Imaging Reconstruction (hereinafter referred to as "SPIRIT"), or the like, or any combination thereof.

In some embodiments, the imaging data of an unsampled point (i.e. a point that is not sampled during a scan) in the regular undersampling region may be determined based on one or more sampled points in a vicinity of the unsampled point. Such a sampled point may be referred to as a neighboring point of the unsampled point. In some embodiments, a neighboring point of a point of interest may be within a certain distance from the point of interest. For example, according to the GRAPPA or the SPIRIT, an unsampled point may be determined based on the neighboring sampled points according to a linear fitting operation. Merely by way of example, the imaging data of one-dimensional unsampled point may be determined by formula below:

$$S_{m,n} = \Sigma_{i,j} C_{i,j} S_{i,j}, \tag{4}$$

where $S_{m,n}$ may represent the imaging data of the unsampled point in channel m, coordinate n in the plane of the k-space, $C_{i,j}$ may represent a weight coefficient, $S_{i,j}$ may represent the imaging data of sample point around $S_{m,n}$, i may represent a coil element, j may represent a coordinate in the plane of the k-space.

In some embodiments, the formula (4) may also be expressed as:

$$Q \cdot S = Q \cdot \Sigma_i W_i \cdot I_i, \tag{5}$$

where $W_i = \text{IFFT}(C'_i)$, and $I_i = \text{IFFT}(S_i)$. IFFT may represent an inverse Fourier arithmetic, Q may represent points with regular undersampling pattern. C' may represent a weight coefficient array derived from C in the formula (4).

Figure 14:
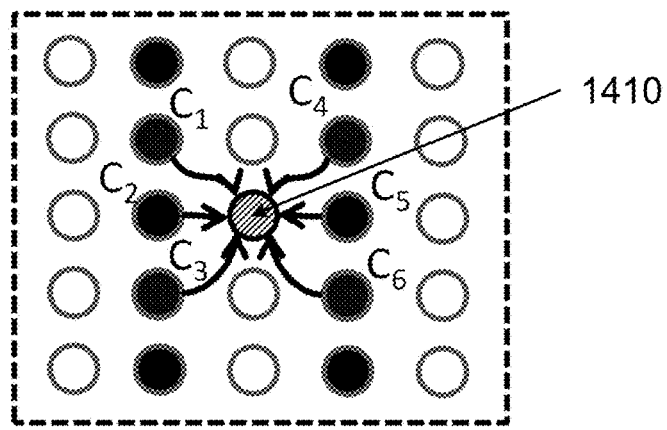
FIG. 14 is a schematic diagram illustrating an exemplary process for image reconstruction of a regular undersampling region according to some embodiments of the present disclosure.

In some embodiments, as shown in FIG. 14, an unsampled point 1410 may be determined based on six neighboring sampled points. For example, the imaging data of the unsampled point 1410 may be represented by $S_{3,3}$. The imaging data of the six sampled points may be represented by $S_{2,2}$, $S_{3,2}$, $S_{4,2}$, $S_{2,4}$, $S_{3,4}$, and $S_{4,4}$. And the weight coefficients of the six points may be represented by $C_1$, $C_2$, $C_3$, $C_4$, $C_5$, and $C_6$ (as shown in FIG. 14). Then the imaging data of the unsampled point 1410 may be determined as:

$$S_{3,3} = C_1 S_{2,2} + C_2 S_{3,2} + C_3 S_{4,2} + C_4 S_{2,4} + C_5 S_{3,4} + C_6 S_{4,4}, \tag{6}$$

In some embodiments, the imaging data of an unsampled point within a region (e.g., one of R2 thorough R4 as illustrated in FIG. 8) may be determined based on imaging data of one or more neighboring sampled points through nonlinear fitting operation. In some embodiments, the unsampled point may also be determined based on all, or essentially all, of the sampled points in the same region. In some embodiments, one or more reconstructed unsampled points may also be used for determining any other unsampled points.

In 1330, an irregular undersampling region may be reconstructed. In some embodiments, the reconstruction of an irregular undersampling region may be based on a parallel imaging technique, a compressed sensing technique, a half-Fourier imaging technique, or the like, or any combination thereof. Exemplary parallel imaging techniques may include GRAPPA, SENSE, SPIRIT, or the like, or any combination thereof. Exemplary compressed sensing techniques may include the minimization of a cost function using gradient descent based algorithms or a soft-thresholding de-noising operation, with a single or multiple regularization operations, such as total variation, wavelet transform, principle component analysis, etc. Exemplary half-Fourier imaging techniques may include a reference phase determination operation, a high-pass filtering operation, a phase correction operation, or the like, or any combination thereof. More details of the reconstruction of the irregular undersampling region may be found in FIGS. 15-19 and the description thereof.

Figure 15:
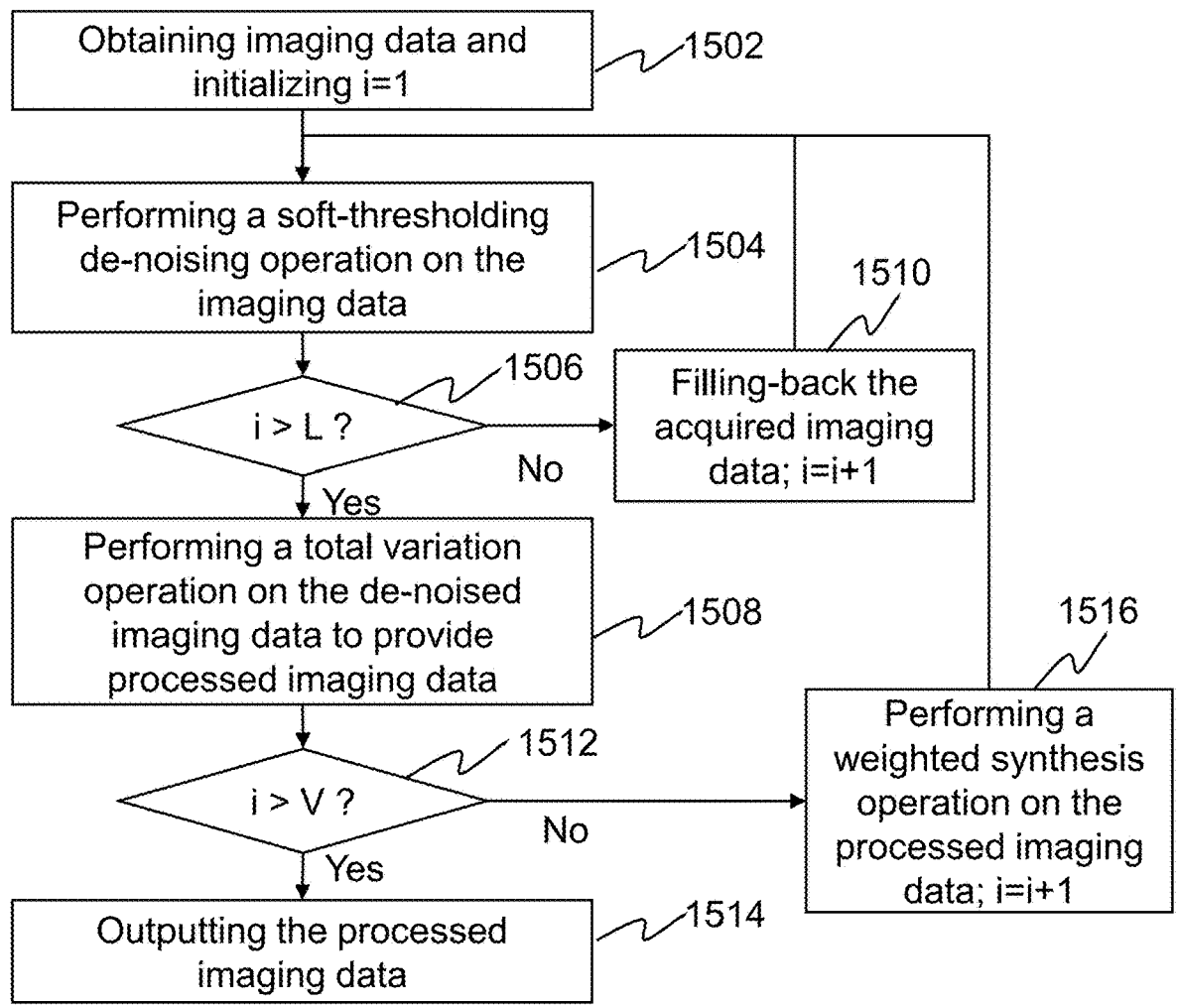
FIG. 15 is a flowchart illustrating an exemplary process for image reconstruction of an irregular undersampling region according to some embodiments of the present disclosure.

FIG. 15 is a flowchart illustrating an exemplary process for image reconstruction according to some embodiments of the present disclosure. In some embodiments, process 1500 of image reconstruction may be a process for reconstructing an irregular undersampling region. As shown in FIG. 15, the image reconstruction may be performed based on a compressed sensing procedure. The compressed sensing procedure may include a soft-thresholding de-noising operation, a total variation operation, a data filling-back operation, a weighted synthesis operation, or the like, or any combination thereof. At least a portion of the process 1500 may be implemented on the computing device 300 as illustrated in FIG. 3 or the mobile device 400 as illustrated in FIG. 4.

In 1502, imaging data relating to a subject, or a portion thereof, may be obtained. In some embodiments, the imaging data may be obtained by the acquisition module 510. The imaging data may be acquired from the human body 210 captured by the MRI system 100. For example, the imaging data may be the MRI data received via the MRI scanner 110.

In 1502, an iteration number i may be set as 1. The iteration number i may be used to record iteration times.

In 1504, a soft-thresholding de-noising operation may be performed on the imaging data. In some embodiments, the soft-thresholding de-noising operation may be performed by the processing module 540. In some embodiments, the soft-thresholding operation may be executed in an image domain or a transform domain. For example, the soft-thresholding de-noising operation may be performed on the coefficients in a sparsifying transform domain of the imaging data. The image domain may be obtained by inverse Fourier transform of the imaging data of the k-space. The transform domain may be determined by Wavelet Transform (WT) operation or another orthogonal transform algorithm. Merely by way of example, one-dimensional WT operation may be used to accelerate the determination speed of the transform domain. In the WT operation of each iteration, the coordinates of pixels associated with the imaging data may be translated by a distance (e.g., 2-8 pixels). A threshold in the soft-thresholding de-noising operation may be determined based on the noise level (as determined in 1310). In some embodiments, different receiving channels may include different thresholds.

In 1506, a determination may be made as to whether i meets a first threshold L. In some embodiments, 1506 may be performed by the processing module 540. If i is greater than L, then the process 1500 may proceed to 1508; otherwise, the process 1500 may proceed to 1510. L may be a positive integer, for example, 10, 100, 1000, etc.

In 1508, a total variation operation may be performed on the de-noised imaging data to provide processed imaging data, as part of constraint reconstruction. In some embodiments, the total variation operation may be performed by the processing module 540. The total variation may be a non-negative, convex, and lower semicontinuous functional on the space of integrable functions. In some embodiments, the total variation may be optimized by a gradient descent operation.

In 1510, the acquired imaging data may be filled back. In some embodiments, the acquired imaging data may be filled back by the processing module 540. The acquired imaging data to be filled back may include original imaging data received via the MRI scanner 110, or reconstructed imaging data of the reconstructed regular undersampling region. Merely by way of example, the acquired imaging data may be filled back according to the formula below:

$$K_f = K_r \cdot (1 - M_{org} - M_{reg}) + K_{org} \cdot M_{org} + K_{pi} \cdot M_{reg}, \quad (6)$$

where $K_f$ may represent imaging data after the filling back operation, $K_r$ may represent imaging data after the soft-thresholding operation, $K_{org}$ may represent the original imaging data (data in the unsampled points may be filled with 0), $K_{pi}$ may represent the imaging data of the reconstructed regular undersampling region, $M_{org}$ may represent a first mask to mark the locations of sampled points, in which the first mask may be filled with 0 or 1. For example, a location in the first mask may be marked as 1 when it corresponds to the location of a sampled point in a scanning plan, otherwise, it may be marked as 0. $M_{reg}$ may represent a second mask to mark the locations of reconstructed unsampled points of the regular undersampling region, in which the second mask may be filled with 0 or 1. For example, a location in the second mask may be marked as 1 when it corresponds to the location of a reconstructed unsampled point of the regular undersampling region, otherwise, it may be marked as 0. The operator "·" may represent a point-to-point multiplication of matrixes or arrays.

After the acquired imaging data is filled back, 1504 may be repeated. Further, in 1510, the iteration number i may be increased by 1, for example, i=i+1.

In 1512, a determination may be made as to whether i meets a second threshold V. In some embodiments, 1512 may be performed by the processing module 540. If i is greater than V, then the process 1500 may proceed to 1514, otherwise, the process 1500 may proceed to 1516. V may be a positive integer.

In 1514, the processed imaging data may be output. And then an image of the subject, or a portion thereof, may be reconstructed according to the processed imaging data.

In 1516, a weighted synthesis operation may be performed on the processed imaging data to generate synthesized imaging data. With the weighted synthesis operation, the total variation operation may have a larger effect to a marginal area and a smaller effect to a central area of the k-space. In some embodiments, a weighting map W including at least one weighting factors of the k-space may be determined. For example, one weighting factor in the weighting map W may be corresponding to a point of the k-space. The weighting factors corresponding to the central area of the k-space may be higher, and the weighting factors corresponding to the marginal area of the k-space may be lower. For example, the weighting factor may be distributed similarly to a Gaussian distribution in the K1 direction and/or the K2 direction. And the weighting factors may range from 0 to 1.

In some embodiments, the weighted synthesis operation may be performed according to the formula below:

$$K_s = (K_{tv} \cdot (1 - W) + K_{no-tv} \cdot W) \cdot (1 \cdot M_{org} - M_{reg}) + (K_{org} \cdot M_{org} + K_{pi} \cdot M_{reg}), \quad (8)$$

where $K_s$ may represent imaging data after the weighted synthesis operation, W may represent the weighting map, $K_{tv}$ may represent imaging data after the total variation operation, and $K_{no-tv}$ may represent imaging data before the total variation operation. $K_{org}$, $K_{pi}$, $M_{org}$, $M_{reg}$ and the operator "·" may be the same as described in connection with 1510 above.

After the weighted synthesis, 1504 may be repeated. Further, in 1516, the iteration number i may be increased by 1, for example, i=i+1.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in 1506, a determination as to whether the imaging data satisfy a condition (e.g., the number of unsampled points without reconstruction is lower than a threshold) may be made instead of a determination as to whether i meets a first threshold L.

It should also be noted that the imaging data in different operations may be the same or different. For example, the imaging data in 1504 may be the data before the soft-thresholding de-noising operation. The imaging data in 1508 may be the data after the soft-thresholding de-noising operation. And the imaging data in 1502 may refer to original imaging data received from the MRI scanner 110.

Figure 16:
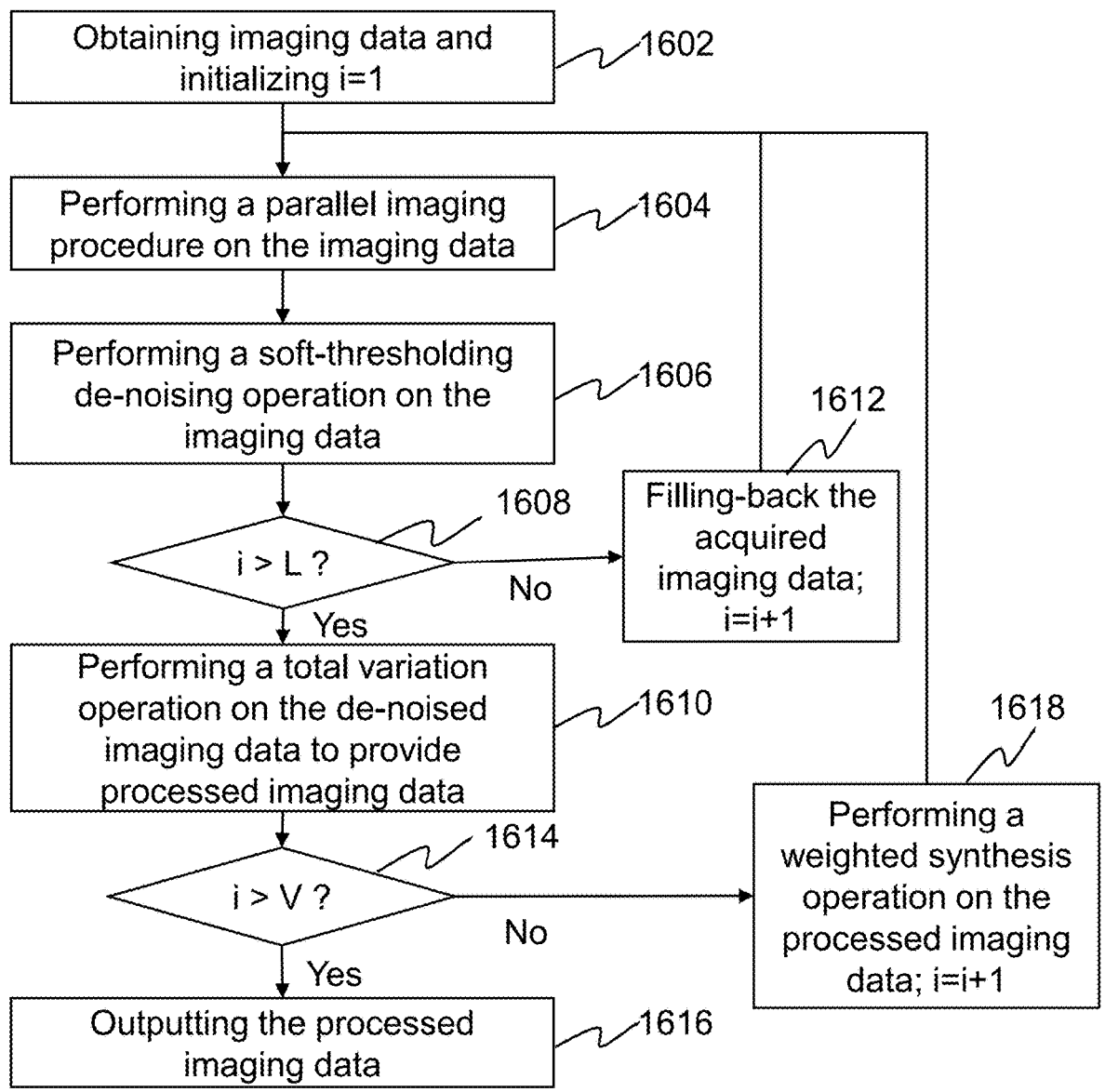
FIG. 16 is a flowchart illustrating an exemplary process for image reconstruction of an irregular undersampling region according to some embodiments of the present disclosure.

FIG. 16 is a flowchart illustrating an exemplary process for image reconstruction according to some embodiments of the present disclosure. In some embodiments, process 1600 of image reconstruction may be a process of reconstructing an irregular undersampling region. As shown in FIG. 16, the image reconstruction may be performed based on a parallel imaging procedure coupled with a compressed sensing procedure. The compressed sensing procedure may include a soft-thresholding de-noising operation, a total variation operation, a data filling-back operation, a weighted synthesis operation, or the like, or any combination thereof. At least a portion of the process 1600 may be implemented on the computing device 300 as illustrated in FIG. 3 or the mobile device 400 as illustrated in FIG. 4.

In 1602, imaging data may be obtained. In some embodiments, the imaging data may be obtained by the acquisition module 510. In some embodiments, the imaging data may be obtained from the human body 210 captured by the MRI system 100. For example, the imaging data may be the MRI data received from the MRI scanner 110.

In 1602, an iteration number i may be set as 1. The iteration number i may be used to record iteration times.

In 1604, a parallel imaging procedure may be performed on the imaging data to assign imaging data for different further processing. In some embodiments, the parallel imaging procedure may be performed by the processing module 540. The parallel imaging procedure may include GRAPPA, SENSE, SPIRIT, or the like, or any combination thereof. In some embodiments, not all data in an undersampled region are to be used for reconstructing an unsampled point. For example, a part of the data (e.g., imaging data of one or more sampled points of an undersampled region) may be selected to reconstruct an unsampled point. In some embodiment, the parallel imaging procedure may be executed in an image domain.

In 1606, a soft-thresholding de-noising operation may be performed on the imaging data, for example, on the coefficients in a sparsifying transform domain of the imaging data. Descriptions of the soft-thresholding de-noising operation may be found elsewhere in the present disclosure. See, for example, FIG. 15 and the description thereof.

In 1608, a determination may be made as to whether i meets a first threshold L. In some embodiments, 1608 may be performed by the processing module 540. If i is greater than L, then the process 1600 may proceed to 1610; otherwise, the process 1600 may proceed to 1612. L may be a positive integer.

In 1610, a total variation operation may be performed on the de-noised imaging data to provide processed imaging data, as part of a constraint reconstruction. In some embodiments, the total variation operation may be performed by the processing module 540. In some embodiments, the total variation operation may be optimized by a gradient descent operation.

In 1612, the acquired imaging data may be filled back to provide filled-back imaging data. Descriptions of the acquired imaging data filling-back operation may be found elsewhere in the present disclosure. See, for example, FIG. 15 and the description thereof. After the process of filling back the acquired imaging data, 1604 may be repeated. Further, in 1612, the processing engine 130 may add the iteration number i with 1, for example, i=i+1.

In 1614, a determination may be made as to whether i meets a second threshold V. In some embodiments, 1614 may be performed by the processing module 540. If i is greater than V, then the process 1600 may proceed to 1616; otherwise, the process 1600 may proceed to 1618. V may be a positive integer.

In 1616, the processed imaging data may be output. And then an image of the human body 210 may be determined according to the processed imaging data.

In 1618, a weighted synthesis operation may be performed on the processed imaging data to generate synthesized imaging data. Descriptions of the weighted synthesis operation may be found elsewhere in the present disclosure. See, for example, FIG. 15 and the description thereof. After performing the weighted synthesis, 1604 may be repeated. Further, in 1618, the iteration number i may be increased by 1, for example, i=i+1.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in 1608, a determination as to whether the imaging data satisfy a condition (e.g., a number of unsampled points without reconstruction is lower than a threshold) may be made, instead of a determination as to whether i meets a first threshold L.

It should also be noted that the imaging data in different operations may be the same or different. For example, the imaging data in 1604 may be the data after the parallel imaging procedure. The imaging data in 1610 may be the data after the soft-thresholding de-noising operation. And the imaging data in 1602 may refer to original imaging data received from the MRI scanner 110.

Figure 17:
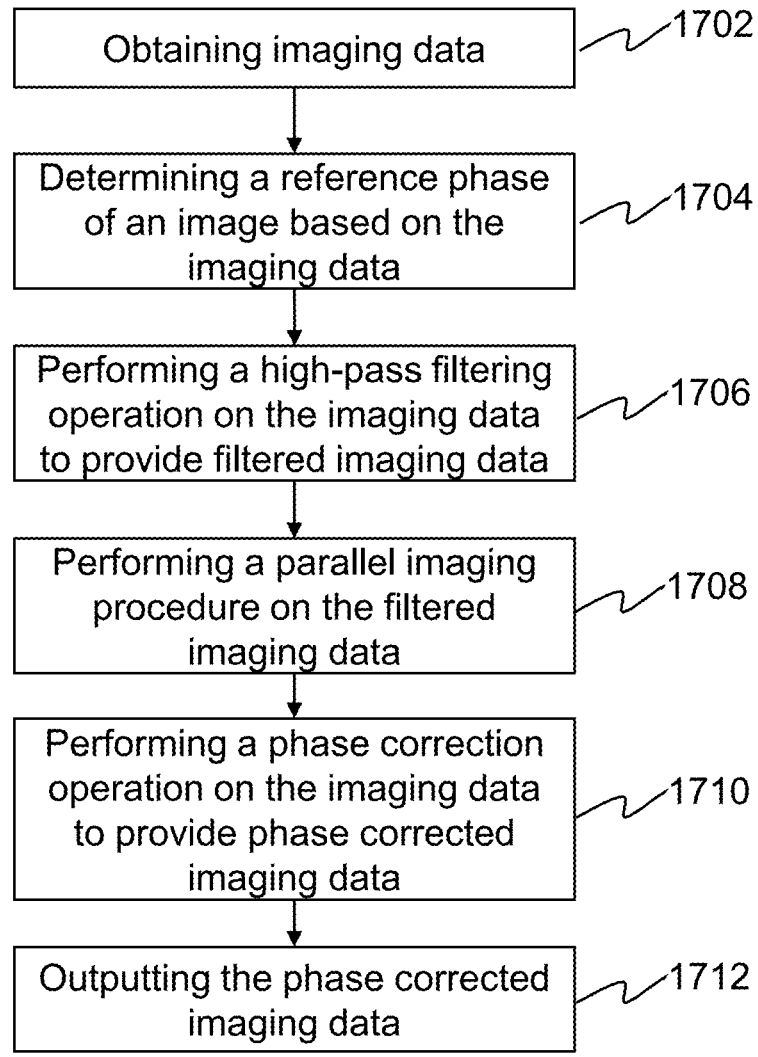
FIG. 17 is a flowchart illustrating an exemplary process for image reconstruction of an irregular undersampling region according to some embodiments of the present disclosure.

FIG. 17 is a flowchart illustrating an exemplary process for image reconstruction according to some embodiments of the present disclosure. In some embodiments, process 1700 of image reconstruction may be a process of reconstructing an irregular undersampling region. As shown in FIG. 17, the image reconstruction may be performed based on a parallel imaging procedure coupled with a half-Fourier imaging procedure. The half-Fourier imaging procedure may include a reference phase determination operation, a high-pass filtering operation, a phase correction operation, or the like, or any combination thereof. At least a portion of the process 1700 may be implemented on the computing device 300 as illustrated in FIG. 3 or the mobile device 400 as illustrated in FIG. 4.

In 1702, imaging data may be obtained. In some embodiments, the imaging data may be obtained by the acquisition module 510. In some embodiments, the imaging data may be acquired from the human body 210 captured by the MRI system 100. For example, the imaging data may be the MRI data received from the MRI scanner 110.

In 1704, a reference phase of an image may be determined based on the imaging data. In some embodiments, 1704 may be performed by the processing module 540. In some embodiments, 1704 may be independent of the process 1700. The determination of the reference phase may include a lowpass filtering operation and an inverse Fourier transform operation. The lowpass filtering operation may be executed by a symmetrical lowpass filter, in which the symmetrical lowpass filter may be radially symmetric with respect to the central point of the k-space. For example, the lowpass filter may be a Gaussian lowpass filter. The lowpass filtering operation may be performed in the k-space with a full sampling pattern, or reconstructed k-space with regular undersampling pattern(s).

In 1706, a high-pass filtering operation may be performed on the imaging data to provide filtered imaging data. In some embodiments, 1706 may be performed by the processing module 540. In the high-pass filtering operation, the ramp weighting of homodyne reconstruction may be determined. Merely by way of example, in a data collection process of one-dimensional half-Fourier, all points on the right side of the k-space may be sampled, a part of points near the margin on the left side of the k-space may not be sampled, other part of points near the center on the left side of the k-space may be sampled with ramp filtering.

In 1708, a parallel imaging procedure may be performed on the filtered imaging data to assign imaging data for different further processing. In some embodiments, 1708 may be performed by the processing module 540. Descriptions of the parallel imaging procedure may be found elsewhere in the present disclosure. See, for example, FIG. 16 and the description thereof.

In 1710, a phase correction operation may be performed on the imaging data to provide phase corrected imaging data. In some embodiments, 1710 may be performed by the processing module 540. In some embodiments, the phase correction operation may be performed as formula below:

$$x_r = \text{real}(x \cdot \exp(-iP)), \quad (9)$$

where P may represent the reference phase determined in 1704, x may represent data in a image domain obtained by inverse Fourier transforming the reconstructed imaging data of the k-space, real may represent an operation of getting the real part of the data, $x_r$ may represent the imaging data after the phase correction operation.

In 1712, the phase corrected imaging data may be output. And then an image of the human body 210 may be determined according to the phase corrected imaging data.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, 1710 may be omitted, and $x_r$ may equal to x. In these embodiments, the data subject to the parallel imaging procedure may be output for storage, and/or image reconstruction.

It should also be noted that the imaging data in different steps may be same or different. For example, the imaging data in 1706 may be the data before the high-pass filtering operation. The imaging data in 1710 may be the data after the parallel imaging procedure. And the imaging data in 1702 may refer to original imaging data received from the MRI scanner 110.

Figure 18:
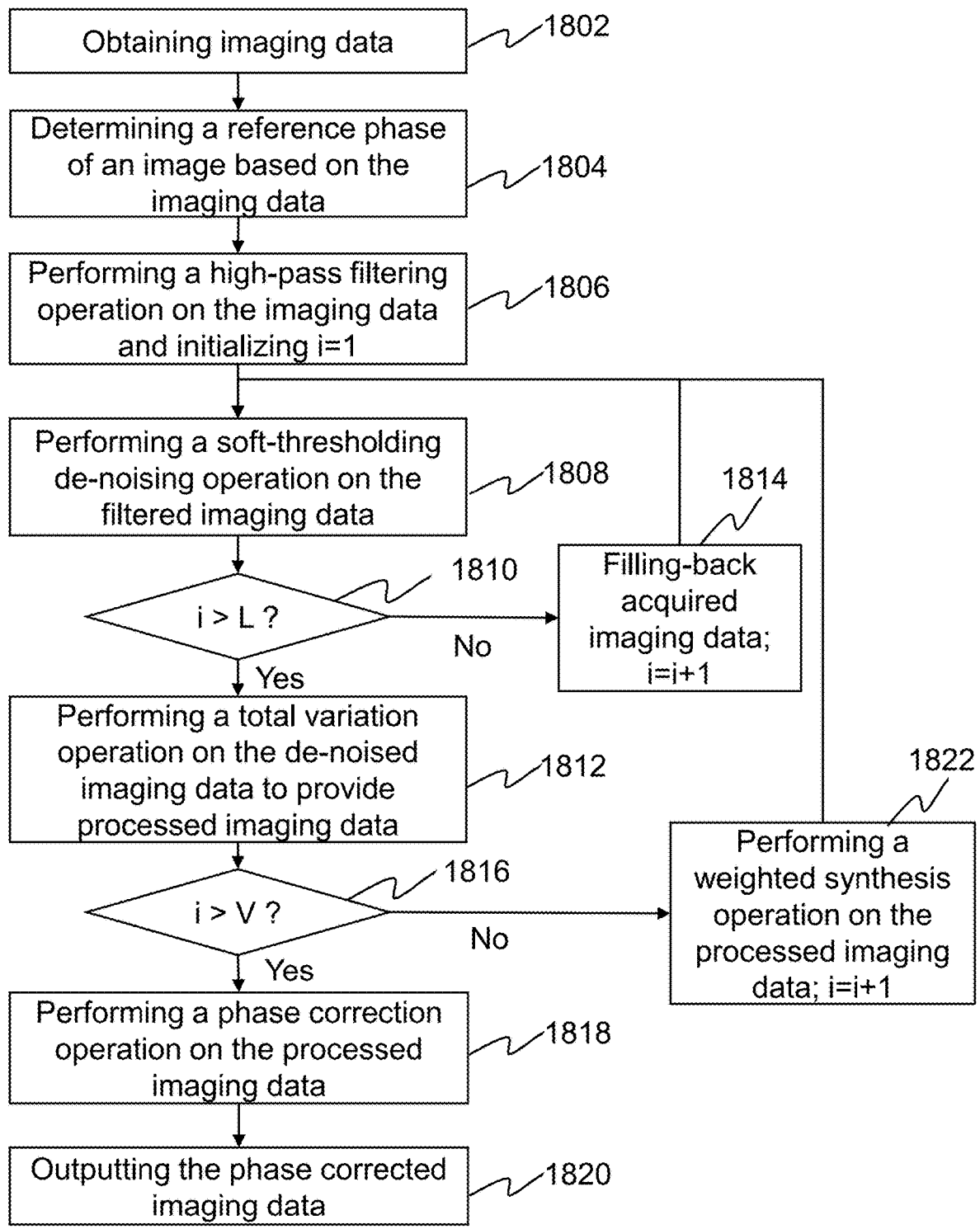
FIG. 18 is a flowchart illustrating an exemplary process for image reconstruction of an irregular undersampling region according to some embodiments of the present disclosure.

FIG. 18 is a flowchart illustrating an exemplary process for image reconstruction according to some embodiments of the present disclosure. In some embodiments, process 1800 of image reconstruction may be a process of reconstructing an irregular undersampling region. As shown in FIG. 18, the image reconstruction may be performed based on a compressed sensing procedure coupled with a half-Fourier imaging procedure. The compressed sensing procedure may include a soft-thresholding de-noising operation, a total variation operation, a data filling-back operation, a weighted synthesis operation, or the like, or any combination thereof. The half-Fourier imaging procedure may include a reference phase determining operation, a high-pass filtering operation, a phase correction operation, or the like, or any combination thereof. At least a portion of the process 1800 may be implemented on the computing device 300 as illustrated in FIG. 3 or the mobile device 400 as illustrated in FIG. 4.

In 1802, imaging data relating to a subject, or a portion thereof, may be obtained. In some embodiments, the imaging data may be obtained by the acquisition module 510. In some embodiments, the imaging data may be acquired from the human body 210 captured by the MRI system 100. For example, the imaging data may be the MRI data received from the MRI scanner 110.

In 1804, a reference phase of an image may be determined based on the imaging data. Detail of the reference phase determination operation may be found elsewhere in the present disclosure. See, for example, FIG. 17 and the description thereof.

In 1806, a high-pass filtering operation may be performed on the imaging data to provide filtered imaging data. Detail of the high-pass filtering operation may be found elsewhere in the present disclosure. See, for example, FIG. 17 and the description thereof.

In 1806, an iteration number i may be set as 1. The iteration number i may be used to record iteration times.

In 1808, a soft-thresholding de-noising operation may be performed on the filtered imaging data, for example, on the coefficients in a sparsifying transform domain of the filtered imaging data. Detail of the soft-thresholding de-noising operation may be found elsewhere in the present disclosure. See, for example, FIG. 15 and the description thereof.

In 1810, a determination may be made as to whether i meets a first threshold L. In some embodiments, 1810 may be performed by the processing module 540. If i is greater than L, then the process 1800 may proceed to 1812; otherwise, the process 1800 may proceed to 1814. L may be a positive integer.

In 1812, a total variation operation may be performed on the de-noised imaging data to provide processed imaging data. In some embodiments, 1812 may be performed by the processing module 540. In some embodiments, the total variation operation may be optimized by a gradient descent operation.

In 1814, the acquired imaging data may be filled back. Detail of the acquired imaging data filling-back operation may be found elsewhere in the present disclosure. See, for example, FIG. 15 and the description thereof. After the process of filling back the acquired imaging data, 1808 may be repeated. Further, in 1814, the iteration number i may be increased by 1, for example, i=i+1.

In 1816, a determination may be made as to whether i meets a second threshold V. In some embodiments, 1816 may be performed by the processing module 540. If i is greater than V, then the process 1800 may proceed to 1818; otherwise, the process 1800 may proceed to 1822. V may be a positive integer.

In 1818, a phase correction operation may be performed on the processed imaging data. Detail of the phase correction operation may be described as in FIG. 17 and the description thereof.

In 1820, the processed imaging data may be output. And then an image of the human body 210 may be determined according to the processed imaging data.

In 1822, a weighted synthesis operation may be performed on the processed imaging data to generate synthesized imaging data. Detail of the weighted synthesis operation may be described as in FIG. 15 and the related description. After performing the weighted synthesis, 1808 may be repeated. Further, in 1822, the processing engine 130 may add the iteration number i with 1, for example, i=i+1.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in 1810, a determination as to whether the imaging data is satisfied with a condition (e.g., a number of unsampled points without reconstruction is lower than a threshold) may be determined instead of a determination as to whether i meets a first threshold L.

It should also be noted that the imaging data in different steps may be same or different. For example, the imaging data in 1812 may be the data after the soft-thresholding de-noising operation. And the imaging data in 1802 may refer to original imaging data received from the MRI scanner 110.

Figure 19:
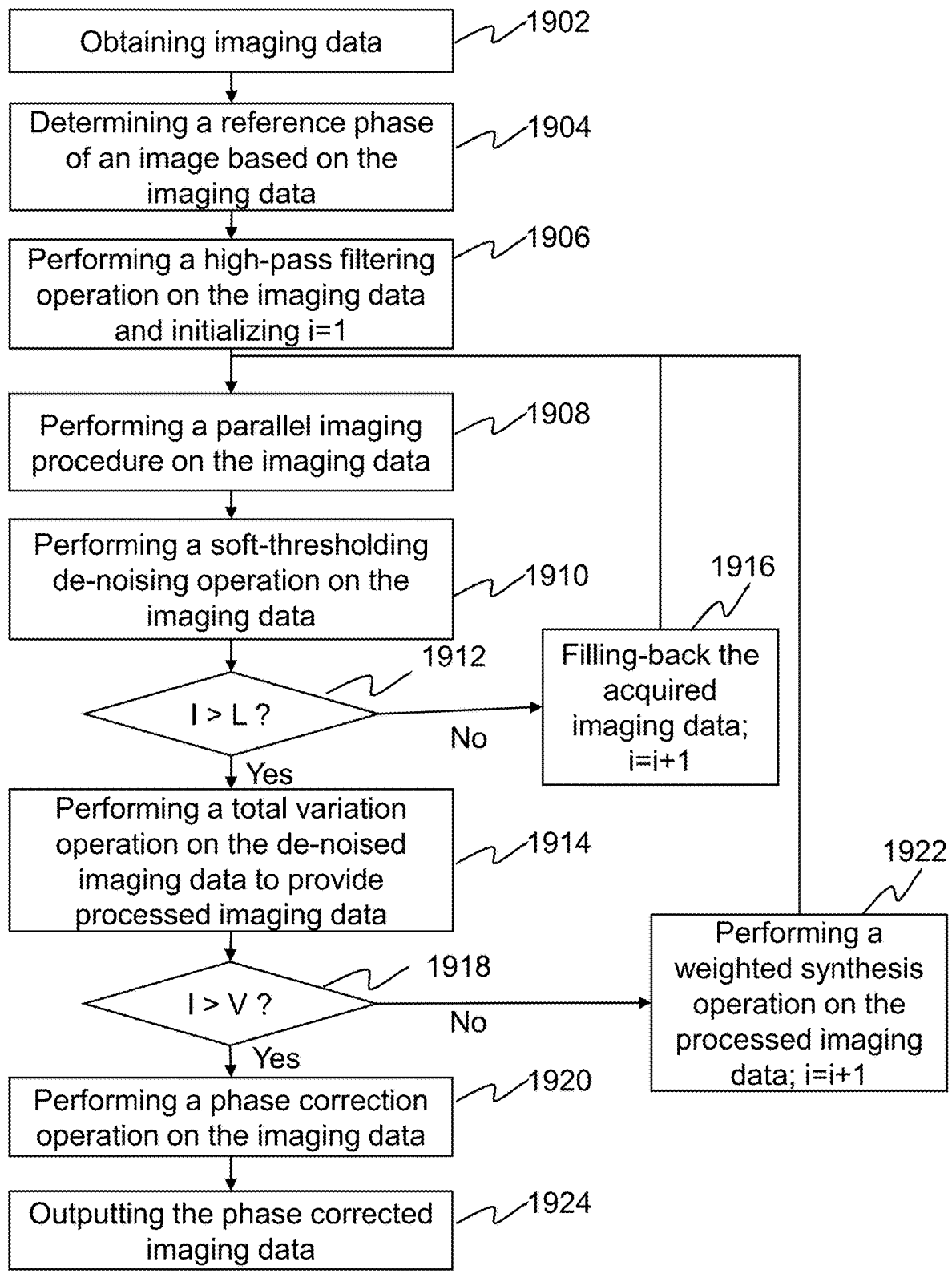
FIG. 19 is a flowchart illustrating an exemplary process for image reconstruction of an irregular undersampling region according to some embodiments of the present disclosure.

FIG. 19 is a flowchart illustrating an exemplary process for image reconstruction according to some embodiments of the present disclosure. In some embodiments, process 1900 of image reconstruction may be a process of reconstructing an irregular undersampling region. As shown in FIG. 19, the image reconstruction may be performed based on a parallel imaging procedure coupled with a compressed sensing procedure and a half-Fourier imaging procedure. The compressed sensing procedure may include a soft-thresholding de-noising operation, a total variation operation, a data filling-back operation, a weighted synthesis operation, or the like, or any combination thereof. The half-Fourier imaging procedure may include a reference phase determining operation, a high-pass filtering operation, a phase correction operation, or the like, or any combination thereof.

In 1902, imaging data relating to a subject, or a portion thereof, may be obtained. In some embodiments, the imaging data may be obtained by the acquisition module 510. In some embodiments, the imaging data may be acquired from the human body 210 captured by the MRI system 100. For example, the imaging data may be the MRI data received from the MRI scanner 110.

In 1904, a reference phase of an image may be determined based on the imaging data. Detail of the reference phase determination operation may be found elsewhere in the present disclosure. See, for example, FIG. 17 and the related description.

In 1906, a high-pass filtering operation on the imaging data to provide filtered imaging data. Detail of the high-pass filtering operation may be found elsewhere in the present disclosure. See, for example, FIG. 17 and the description thereof.

In 1906, an iteration number i may be set as 1. The iteration number i may be used to record iteration times.

In 1908, a parallel imaging procedure may be performed on the filtered imaging data to assign imaging data for different further processing. Detail of the parallel imaging procedure may be found elsewhere in the present disclosure. See, for example, FIG. 16 and the description thereof.

In 1910, a soft-thresholding de-noising operation may be performed on the imaging data, for example, on the coefficients in a sparsifying transform domain of the imaging data. Detail of the soft-thresholding de-noising operation may be found elsewhere in the present disclosure. See, for example, FIG. 15 and the description thereof.

In 1912, a determination may be made as to whether i meets a first threshold L. In some embodiments, 1912 may be performed by the processing module 540. If i is greater than L, then the process 1800 may proceed to 1914; otherwise, the process 1800 may proceed to 1916. L may be a positive integer.

In 1914, a total variation operation may be performed on the de-noised imaging data to provide processed imaging data. In some embodiments, the total variation operation may be performed by the processing module 540. In some embodiments, the total variation operation may be optimized by a gradient descent operation.

In 1916, the acquired imaging data may be filled back. Detail of the acquired imaging data filling-back operation may be found elsewhere in the present disclosure. See, for example, FIG. 15 and the description thereof. After the process of filling back the acquired imaging data, 1908 may be repeated. Further, in 1916, the iteration number i may be increased by 1, for example, i=i+1.

In 1918, a determination may be made as to whether i meets a second threshold V. In some embodiments, 1918 may be performed by the processing module 540. If i is greater than V, then the process 1800 may proceed to 1920; otherwise, the process 1800 may proceed to 1922. V may be a positive integer.

In 1920, a phase correction operation may be performed on the imaging data. Detail of the phase correction operation may be found elsewhere in the present disclosure. See, for example, FIG. 17 and the description thereof.

In 1922, a weighted synthesis operation may be performed on the processed imaging data to generate synthesized imaging data. Detail of the weighted synthesis operation may be found elsewhere in the present disclosure. See, for example, FIG. 15 and the description thereof. After performing the weighted synthesis, 908 may be repeated. Further, in 1922, the iteration number i may be increased by 1, for example, i=i+1.

In 1924, the phase corrected imaging data may be output. And then a reconstruction image of the human body 210 may be determined according to the phase corrected imaging data.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in 1912, a determination as to whether the imaging data is satisfied with a condition (e.g., a number of unsampled points without reconstruction is lower than a threshold) may be determined instead of a determination as to whether i meets a first threshold L.

It should also be noted that the imaging data in different steps may be same or different. For example, the imaging data in 1914 may be the data after the soft-thresholding de-noising operation. And the imaging data in 1902 may refer to original imaging data received from the MRI scanner 110.

FIGS. 20-A, 20-B, and 20-C show exemplary MRI images reconstructed based on the image reconstruction techniques according to some embodiments of the present disclosure. As shown in FIGS. 20-A to 20-C, the MRI image was an image for a whole liver. The FIG. 20-A may be a top view of the liver, the FIG. 20-B may be a front view of the liver, and the FIG. 20-C may be a side view of the liver. The imaging data was collected with high resolution, in which the voxel of the imaging data was 1.9 millimeters*1.9 millimeters*1.9 millimeters. And the imaging data was completely collected within 18 seconds breath-holding. The acceleration factor of the imaging data was 3.5.

It should be noted that the above description of the processing module is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the weighted synthesis operation may be unnecessary.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as JAVA, SCALA, SMALLTALK, EIFFEL, JADE, EMERALD, C++, C#, VB. NET, PYTHON or the like, conventional procedural programming languages, such as the "C" programming language, Visual Basic, Fortran 2013, PERL, COBOL 2012, PHP, ABAP, dynamic programming languages such as PYTHON, RUBY, and GROOVY, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximately," or "substantially." For example, "about," "approximately," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A system, comprising:
   at least one non-transitory computer-readable storage medium including a set of instructions; and
   at least one processor in communication with the at least one non-transitory computer-readable storage medium, wherein when executing the instructions, the system is directed to:
   divide a plane of a k-space into a first region and a second region, wherein the second region is adjacent to the first region;
   divide the second region into a third region, a fourth region, a fifth region, and a sixth region, wherein the first region is located in a center section of the plane of the k-space, the first region is defined by at least four sides including two sides in a first direction and two sides in a second direction different from the first direction, the third region is located along the two sides of the first region in the first direction, the fourth region is located along the two sides of the first region in the second direction, the fourth region is defined by at least two sides in the first direction, the fifth region is located along the two sides of the fourth region in the first direction, and wherein the first region has a larger sampling density than the third region, and the fourth region has a larger sampling density than the fifth region;

assign the first region a full sampling pattern;

assign at least one part of the second region an irregular undersampling pattern, the irregular undersampling pattern including a restrained undersampling pattern, wherein the restrained undersampling pattern includes a restraint region, the restraint region being determined by a process including:

determining a first unsampled point at a central section of the restraint region;

determining a second unsampled point adjacent to the first unsampled point along a first predetermined direction; and determining a third unsampled point whose position satisfies a predetermined positional relationship with the first unsampled point, the first unsampled point and the third unsampled point being aligned along a second predetermined direction that is different from the first predetermined direction;

sampling a plurality of remaining points in the restraint region with a certain probability; and determine a Magnetic Resonance Imaging (MRI) scanning plan according to the plane of the k-space, wherein the k-space is a Fourier space of a three dimensional MRI image, and the plane of the k-space is based on at least one phase encoding direction of a pulse sequence.

2. The system of claim 1, wherein the system is further directed to:

divide the second region into a seventh region and a eighth region; and assign at least one part of the seventh region the irregular undersampling pattern.

3. The system of claim 2, wherein the system is further directed to:

assign at least one part of the eighth region a regular undersampling pattern, wherein a sampling rate of the fourth region is 1/R, and wherein R is a positive integer greater than 1.

4. The system of claim 1, wherein the system is further directed to:

obtain imaging data of a subject, or a portion thereof, based on the MRI scanning plan;

execute a first iterative procedure comprising:

performing a soft-thresholding de-noising operation on a sparsifying transform domain of the imaging data; and determining a first iteration number of the soft-thresholding de-noising operation;

determine that the first iteration number meets a first threshold;

execute, in response to determining that the first iteration number meets the first threshold, a second iterative procedure comprising:

performing a total variation algorithm on the de-noised imaging data to provide processed imaging data; and determining a second iteration number of the total variation algorithm operation;

determine that a sum of the first iteration number and the second iteration number meets a second threshold; and generate a reconstruction image of the subject, or a portion thereof, based on the processed imaging data, wherein the first threshold is lower than the second threshold.

5. The system of claim 4, wherein the system is further directed to:

optimize the total variation algorithm by a gradient descent operation.

6. The system of claim 4, wherein the first iterative procedure further comprising:

filling back the acquired imaging data into the k-space obtained after de-noising operation; and performing the de-noising operation on the sparsifying transform domain of the filled-back imaging data.

7. The system of claim 4, wherein the system is further directed to:

determine that the sum of the first iteration number and the second iteration number is lower than the second threshold; and the performing a soft-thresholding de-noising operation on a sparsifying transform domain of the imaging data including:

performing a weighted synthesis operation on the processed imaging data to generate synthesized imaging data; and performing the soft-thresholding de-noising operation on the sparsifying transform domain of the synthesized imaging data.

8. The system of claim 4, wherein the system is further directed to:

determine a reference phase of the imaging data;

perform a high-pass filtering operation on the imaging data to generate filtered imaging data;

determine that the sum of the first iteration number and the second iteration number meets the second threshold; and perform, based on the reference phase, a phase correction operation on the filtered imaging data to generate phase corrected imaging data, wherein the processed imaging data include the phase corrected imaging data.

9. The system of claim 8, wherein the system is further directed to:

obtain the processed imaging data by performing a parallel imaging procedure on the phase corrected imaging data.

10. A system, comprising:

at least one non-transitory computer-readable storage medium including a set of instructions; and at least one processor in communication with the at least one non-transitory computer-readable storage medium, wherein when executing the instructions, the system is directed to:

divide a plane of a k-space into a first region and a second region, wherein the second region is adjacent to the first region;

divide the second region into a third region, a fourth region, a fifth region, and a sixth region, wherein the first region is located in a center section of the plane of the k-space, the first region is defined by at least four sides including two sides in a first direction and two sides in a second direction different from the first direction, the third region is located along the two sides of the first region in the first direction, the fourth region is located along the two sides of the first region in the second direction, the fourth region is defined by at least two sides in the first direction, the fifth region is located along the two sides of the fourth region in the first direction, and wherein the first region has a larger sampling density than the third region, and the fourth region has a larger sampling density than the fifth region;

obtain imaging data of a subject, or a portion thereof, captured by an MRI system according to an undersampling pattern, the undersampling pattern including a restrained undersampling pattern, wherein the restrained undersampling pattern includes a restraint region, the restraint region being determined by a process including:
- determining a first unsampled point at a central section of the restraint region;
- determining a second unsampled point adjacent to the first unsampled point along a first predetermined direction; and
- determining a third unsampled point whose position satisfies a predetermined positional relationship with the first unsampled point, the first unsampled point and the third unsampled point being aligned along a second predetermined direction that is different from the first predetermined direction;
- sampling a plurality of remaining points in the restraint region with a certain probability;

execute a first iterative procedure comprising:
- performing a soft-thresholding de-noising operation on a sparsifying transform domain of the imaging data; and
- determining a first iteration number of the soft-thresholding de-noising operation;

determine that the first iteration number meets a first threshold;

execute, in response to the determination that the first iteration number meets the first threshold, a second iterative procedure comprising:
- performing a total variation algorithm on the de-noised imaging data to provide processed imaging data; and
- determining a second iteration number of the total variation algorithm operation;

determine that a sum of the first iteration number and the second iteration number meets a second threshold; and generate a reconstruction image of the subject, or a portion thereof, according to the processed imaging data, wherein the first threshold is lower than the second threshold.

11. The system of claim 10, wherein the system is further directed to:
optimize the total variation algorithm by a gradient descent operation.

12. The system of claim 10, wherein the first iterative procedure further comprising:
filling back the acquired imaging data into the k-space obtained after de-noising operation; and
performing the de-noising operation on the sparsifying transform domain of the filled-back imaging data.

13. The system of claim 10, wherein the system is further directed to:
determine that the sum of the first iteration number and the second iteration number is lower than the second threshold;
perform a weighted synthesis operation on the processed imaging data to generate synthesized imaging data; and
perform the soft-thresholding de-noising operation on the sparsifying transform domain of the synthesized imaging data.

14. The system of claim 10, wherein the system is further directed to:
perform a parallel imaging procedure on the imaging data.

15. The system of claim 10, wherein the system is further directed to:
determine a reference phase of the imaging data;
perform a high-pass filtering operation on the imaging data to generate filtered imaging data;
determine that the sum of the first iteration number and the second iteration number meets the second threshold; and
perform, based on the reference phase, a phase correction operation on the filtered imaging data to generate phase corrected imaging data,
wherein the processed imaging data include the phase corrected imaging data.

16. The system of 12, wherein the system is further directed to:
obtain the processed imaging data by performing a parallel imaging procedure on the phase corrected imaging data.

17. A system, comprising:
at least one non-transitory computer-readable storage medium including a set of instructions; and
at least one processor in communication with the at least one non-transitory computer-readable storage medium, wherein when executing the instructions, the system is directed to:
divide a plane of a k-space into a first region and a second region, wherein the second region is adjacent to the first region;
divide the second region into a third region, a fourth region, a fifth region, and a sixth region, wherein the first region is located in a center section of the plane of the k-space, the first region is defined by at least four sides including two sides in a first direction and two sides in a second direction different from the first direction, the third region is located along the two sides of the first region in the first direction, the fourth region is located along the two sides of the first region in the second direction, the fourth region is defined by at least two sides in the first direction, the fifth region is located along the two sides of the fourth region in the first direction, and wherein the first region has a larger sampling density than the third region, and the fourth region has a larger sampling density than the fifth region;
obtain imaging data of a subject, or a portion thereof, captured by an MRI system according to an undersampling pattern, the undersampling pattern including a restrained undersampling pattern, wherein the restrained undersampling pattern includes a restraint region, the restraint region being determined by a process including:
- determining a first unsampled point at a central section of the restraint region;
- determining a second unsampled point adjacent to the first unsampled point along a first predetermined direction; and
- determining a third unsampled point whose position satisfies a predetermined positional relationship with the first unsampled point, the first unsampled point and the third unsampled point being aligned along a second predetermined direction that is different from the first predetermined direction;
- sampling a plurality of remaining points in the restraint region with a certain probability;

determine a reference phase of an image based on the imaging data;
perform a high-pass filtering operation on the imaging data to provide filtered imaging data;
perform a parallel imaging procedure on the filtered imaging data;
perform a phase correction operation on the imaging data to provide phase corrected imaging data; and
determine a reconstruction image of the subject, or a portion thereof, according to the phase corrected imaging data.

* * * * *